(12) United States Patent
Holloway et al.

(10) Patent No.: US 7,119,612 B1
(45) Date of Patent: Oct. 10, 2006

(54) DUAL-CHANNEL INSTRUMENTATION AMPLIFIER

(75) Inventors: Peter R. Holloway, Groveland, MA (US); Jun Wan, Wilmington, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 44 days.

(21) Appl. No.: 10/954,417

(22) Filed: Sep. 29, 2004

Related U.S. Application Data

(60) Provisional application No. 60/534,446, filed on Jan. 5, 2004.

(51) Int. Cl.
*H03F 1/02* (2006.01)
*H03F 3/45* (2006.01)

(52) U.S. Cl. .......................... 330/9; 330/253
(58) Field of Classification Search .............. 330/9, 330/253
See application file for complete search history.

(56) References Cited

U.S. PATENT DOCUMENTS 6,011,436 A * 1/2000 Koike ..................... 330/253
6,359,510 B1 * 3/2002 Ishii et al. ................ 330/253
6,639,431 B1 10/2003 Potter
6,798,293 B1 * 9/2004 Casper et al. ............. 330/253

* cited by examiner

*Primary Examiner*—Khanh Van Nguyen
(74) *Attorney, Agent, or Firm*—Patent Law Group LLP; Carmen C. Cook

(57) ABSTRACT

A dual-channel instrumentation amplifier includes two channels of PMOS transistor differential pairs which are configured in a Y-connection and cross-coupled to two diode-connected NMOS transistors. Each input channel has a non-linear voltage-current characteristic. But when the differential currents cancel at the NMOS transistor diodes, both input channels have the same differential input voltage, regardless of any non-linearity. As thus configured, a high accuracy instrumentation amplifier which operates in current mode is realized with excellent DC matching and high common mode rejection ratio. In one embodiment, the dual-channel instrumentation amplifier is used as input stage for the linear comparator to enable the linear comparator to operate at a high rate of speed with excellent channel matching.

15 Claims, 18 Drawing Sheets

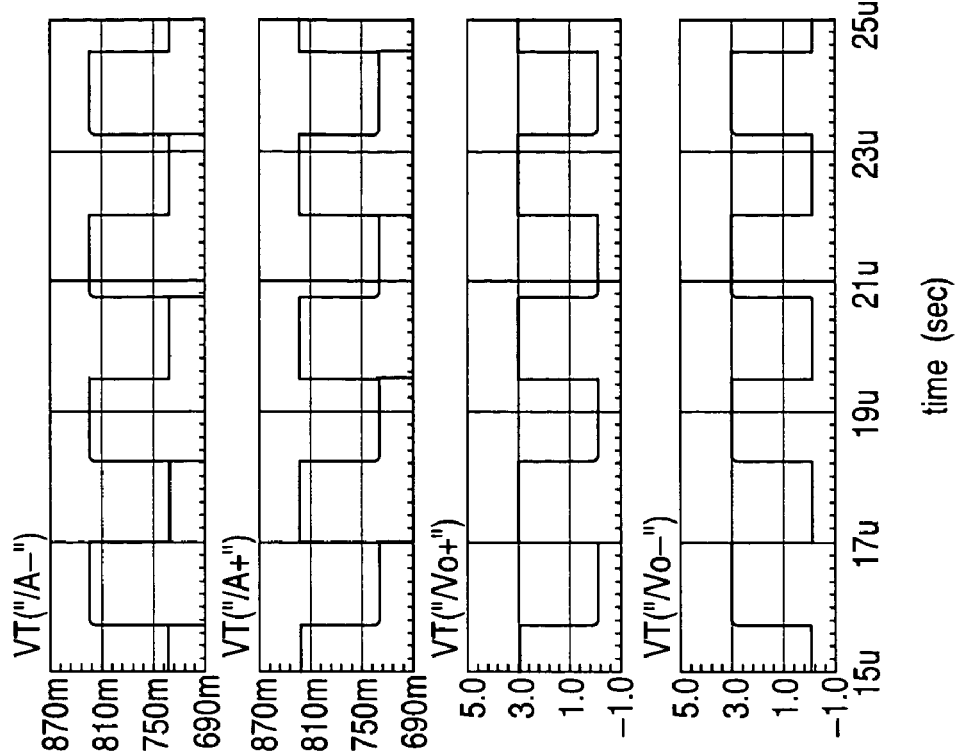
FIG. 4A
FIG. 4B
FIG. 4C
FIG. 4D
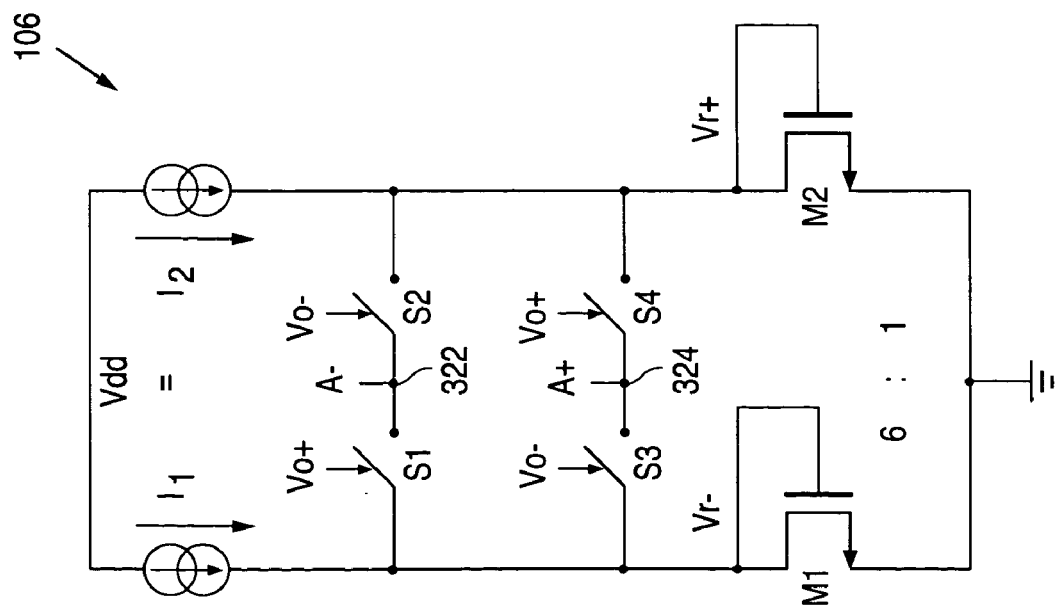
FIG. 3

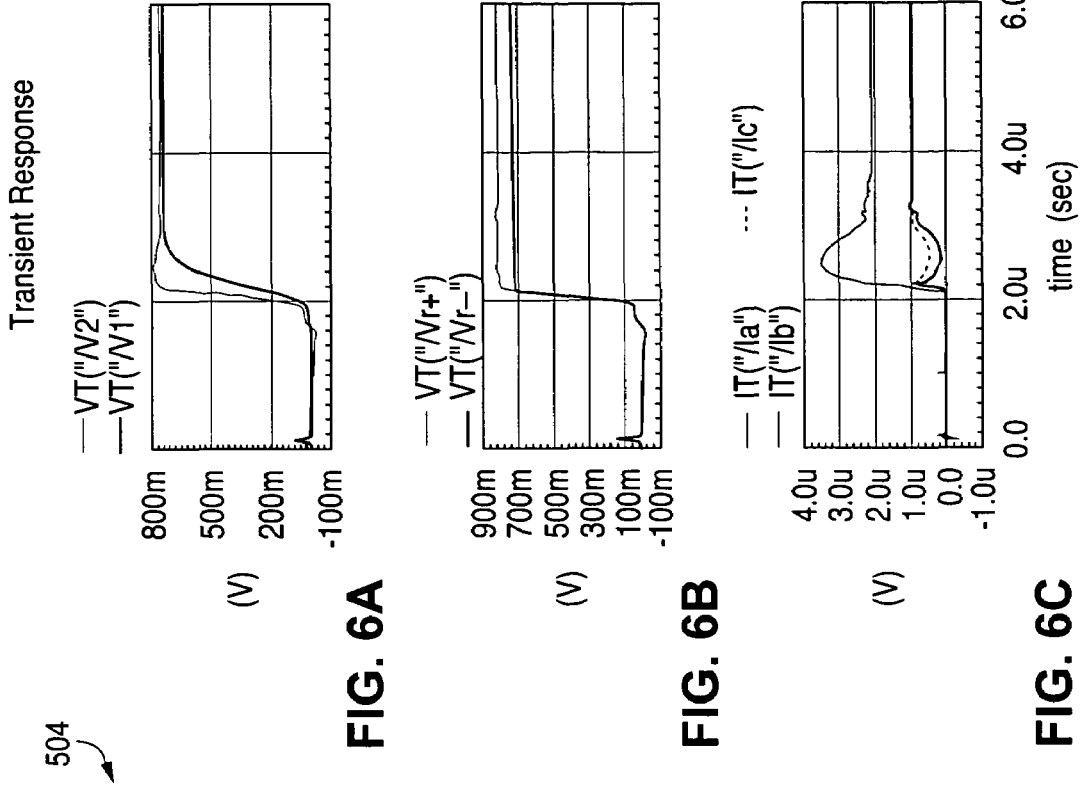
FIG. 6A
FIG. 6B
FIG. 6C
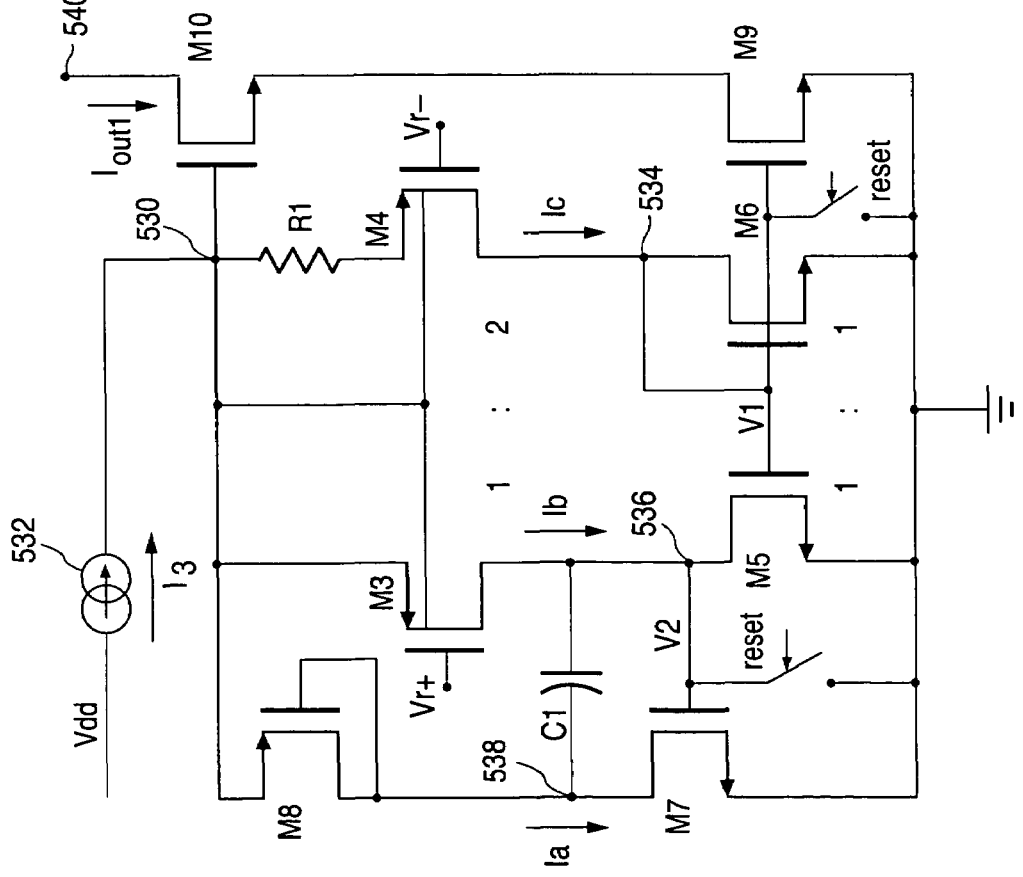
FIG. 5

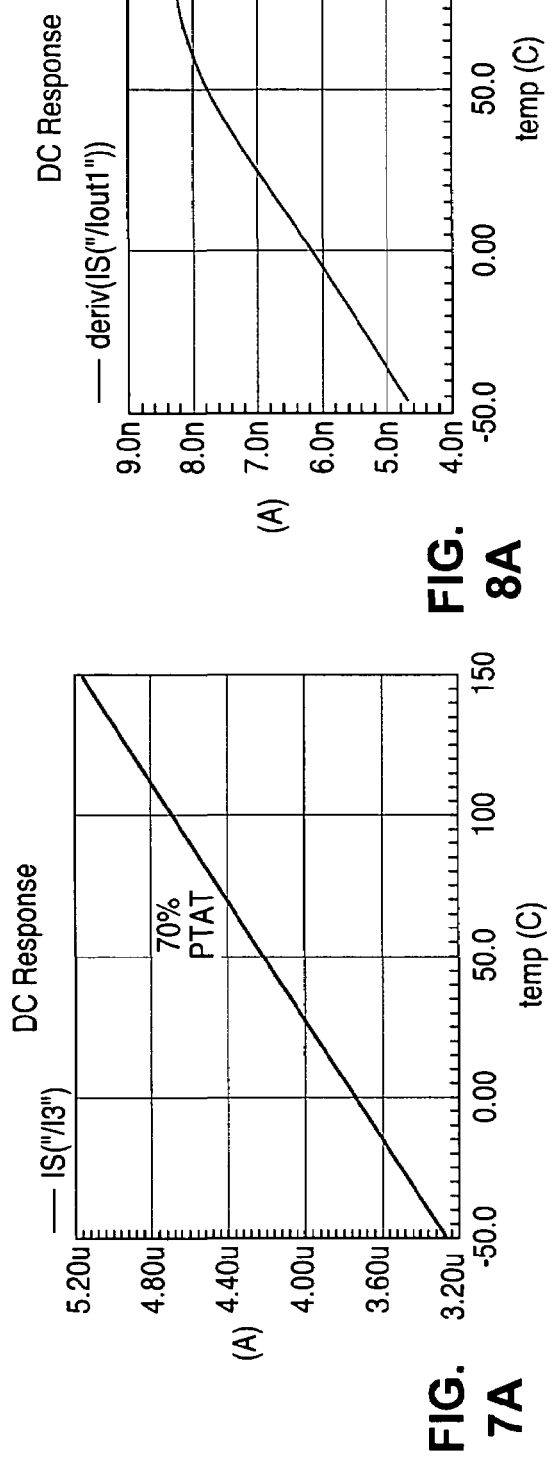
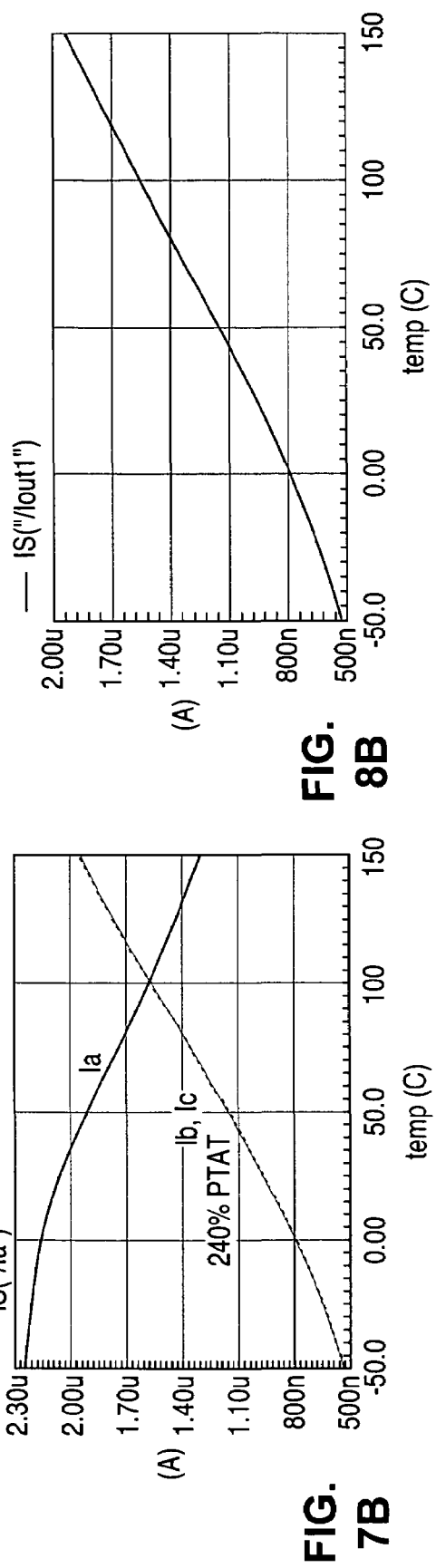
FIG. 7A
FIG. 7B
FIG. 8A
FIG. 8B

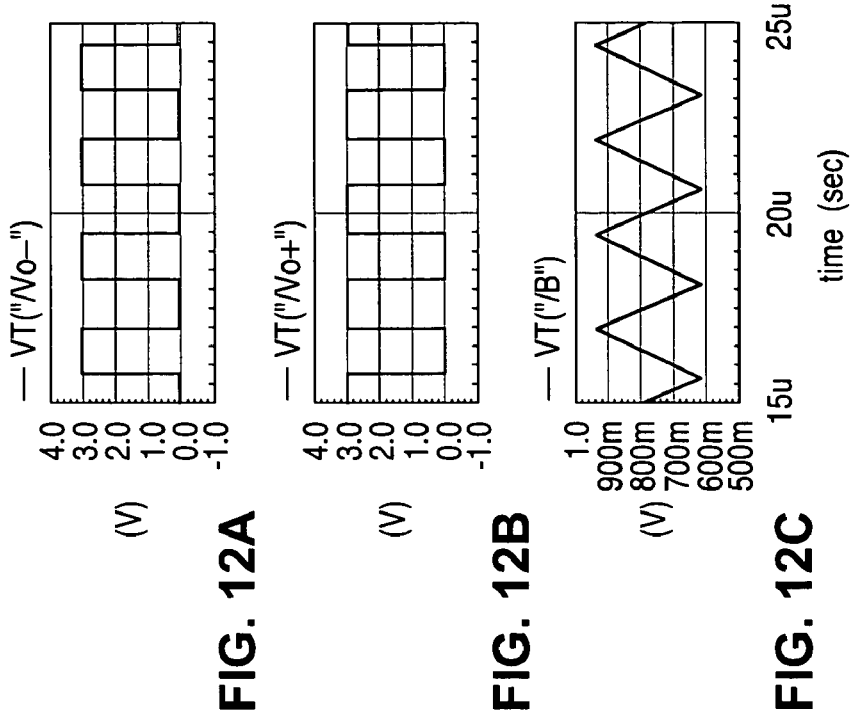
FIG. 12A
FIG. 12B
FIG. 12C
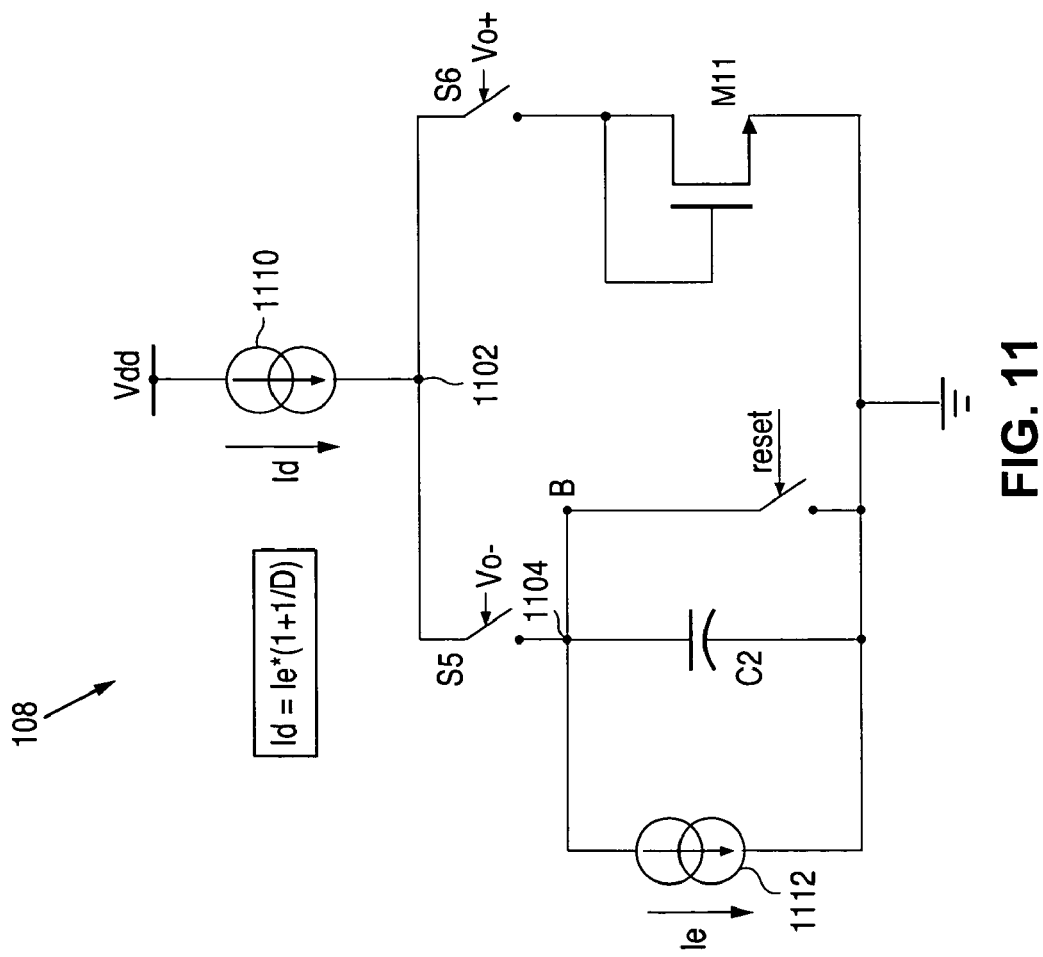
FIG. 11 time (sec)

DUAL-CHANNEL INSTRUMENTATION AMPLIFIER

CROSS-REFERENCE TO RELATED APPLICATION

This application claims the benefit of U.S. Provisional Patent Application Ser. No. 60/534,446, filed on Jan. 5, 2004, having the same inventorship hereof, which application is incorporated herein by reference in its entirety.

This application is related to the following concurrently filed and commonly assigned U.S. patent applications: U.S. patent application Ser. No. 10/954,465, entitled "Clock Generator Circuit Stabilized Over Temperature, Process and Power Supply Variations," of Jun Wan et al.; and U.S. patent application Ser. No. 10/954,698, entitled "Super-PTAT Current Source," of P. Holloway et al. The aforementioned patent applications are incorporated herein by reference in their entireties.

FIELD OF THE INVENTION

The invention relates to an instrumentation amplifier and, in particular, to a dual channel instrumentation amplifier for use as a comparator input stage.

BRIEF DESCRIPTION OF THE DRAWINGS

FIG. 3 is a circuit diagram of a voltage reference generator which can be incorporated in the clock generator circuit of FIG. 2 according to one embodiment of the present invention.

FIG. 4, which includes FIGS. 4A to 4D, includes waveforms illustrating the operation of the voltage reference generator circuit of FIG. 3.

FIG. 5 is a circuit diagram of a super-PTAT current source according to one embodiment of the present invention.

FIG. 6, which includes FIGS. 6A to 6C, includes transient simulation waveforms of voltages V1, V2, Vr+, Vr− and currents Ia, Ib and Ic of the super-PTAT current source of FIG. 5 during initial startup conditions.

FIG. 7, which includes FIGS. 7A and 7B, includes temperature sweep simulation waveforms of current I3 and the currents Ia, Ib and Ic in the super-PTAT current source of FIG. 5.

FIG. 8, which includes FIGS. 8A and 8B, includes temperature sweep simulation waveforms of the output current Iout1 and the derivative of the current Iout1 of the super-PTAT current source of FIG. 5.

FIG. 11 is a circuit diagram of a voltage ramp generator according to one embodiment of the present invention.

FIG. 12, which includes FIGS. 12A to 12C, includes simulation waveforms of the comparator output voltages Vo+ and Vo− and the ramp voltage output "B" of the voltage ramp generator of FIG. 11.

DETAILED DESCRIPTION OF THE PREFERRED EMBODIMENTS

Figure 1:
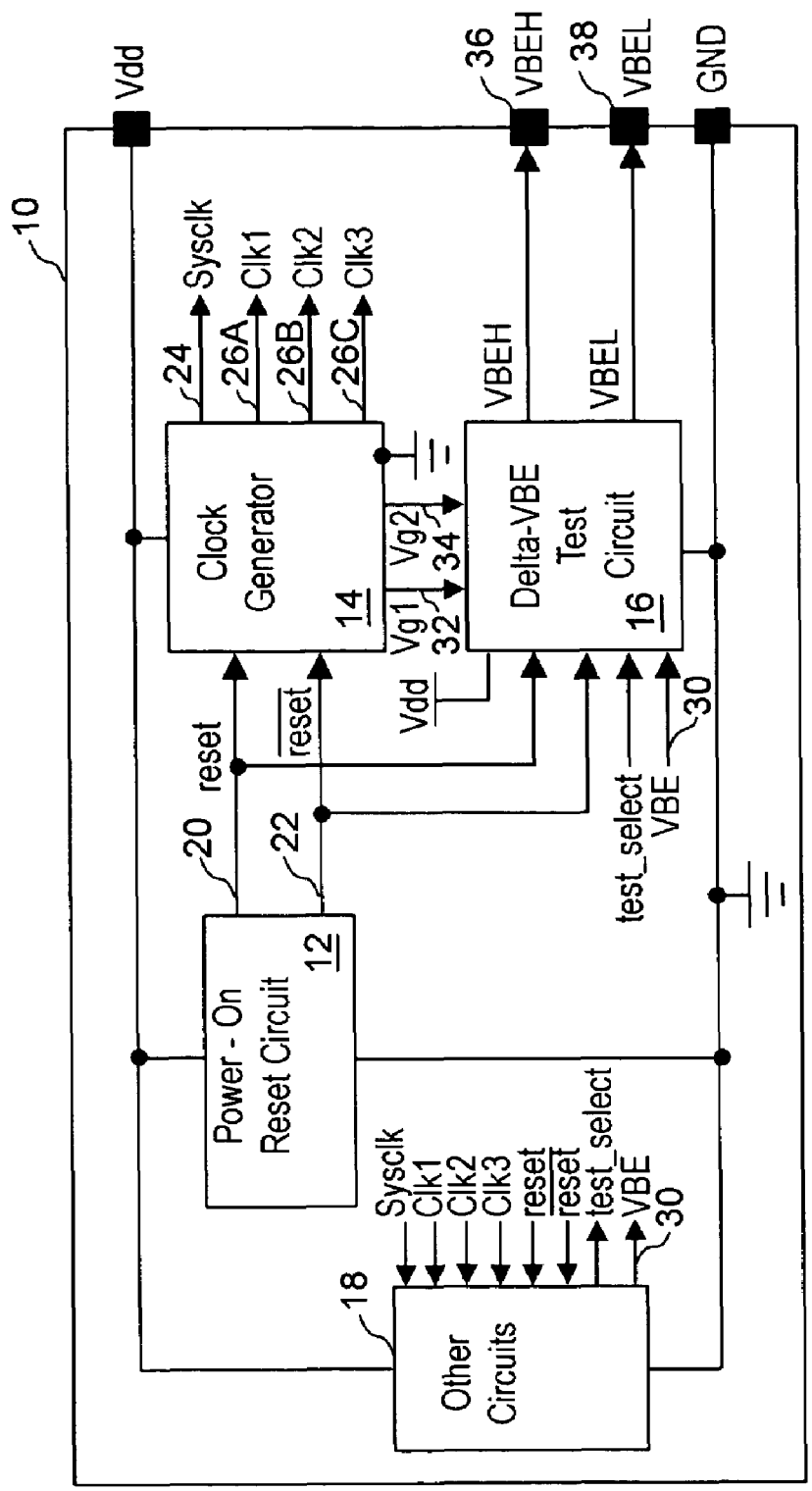
FIG. 1 is a schematic diagram of a digitizing temperature sensor system in which the clock generator circuit can be incorporated.

In accordance with the present invention, a clock generator circuit incorporates a sub-PTAT (proportional to absolute temperature) current source and a super-PTAT current source for generating bias currents for a voltage reference generator and charging currents for a voltage ramp generator. The clock generator circuit further includes a linear comparator, coupled to receive one or more switching voltage reference signals and a voltage ramp signal, that generates a switching output signal as the clock signal. The clock signal is coupled to a clock decoder to generate the desired clock signals having the desired phase. The functional blocks of the clock generator circuit of the present invention operate together to generate a highly frequency stable clock signal. In one embodiment, the linear comparator incorporates a dual-differential-input (dual-channel) instrumentation amplifier as the comparator input stage to generate clock signals having clock frequency errors that are minimized over process, temperature and power supply variations. The clock generator circuit of the present invention can be formed in an integrated circuit to function as an internal clock source providing clock signals for all circuitry in the integrated circuit. Alternately, the clock signals generated by the clock generator circuit can be coupled off-chip to other components.

According to one embodiment of the present invention, the clock generator circuit includes six functional blocks: 1) a sub-PTAT current source, 2) a super-PTAT current source, 3) a voltage reference generator, 4) a voltage ramp generator, 5) a linear comparator and 6) a multi-phase clock decoder. The sub-PTAT current source generates a sub-PTAT current with constant temperature coefficient (TC) based on a PTAT reference voltage imposed on a resistor with a partially PTAT temperature coefficient (TC). The voltage reference generator, biased by the sub-PTAT current source, duplicates the PTAT reference voltage from the sub-PTAT current source and provides a set of voltages having a difference equal to the PTAT reference voltage to the super-PTAT current source. The voltage reference generator also generates one or more switching voltage reference signals. The super-PTAT current source generates a super-PTAT current which is mixed with the sub-PTAT current from the sub-PTAT current source to generate a set of charging and discharging currents to the voltage ramp generator. The voltage ramp generator generates a voltage ramp signal based in part on the charging and discharging currents.

In the present embodiment, the linear comparator receives as input signals the voltage ramp signal from the voltage ramp generator and the pair of switching voltage reference signals from the voltage reference generator. A feedback loop is established whereby the output signals of the linear comparator are fed back to control the switching of voltage ramp signal and the switching of the voltage reference signals. This repeating cycle of oscillation toggles the charging and discharging currents provided to a charging capacitor in the voltage ramp generator thereby creating a nearly ideal triangular waveform as the voltage ramp signal. One of the output signals of the linear comparator is coupled to the clock decoder for generating the desired multi-phase clock signals. The multi-phase clock signals can then be coupled to drive circuitry on the integrated circuit in which the clock generator circuit is incorporated. Alternately, the multi-phase clock signals can also be coupled off-chip to drive circuitry outside of the integrated circuit in which the clock generator is incorporated.

The clock generator circuit of the present invention includes the following novel features. First, the voltage reference generator is capable of generating an extremely precise PTAT voltage using only CMOS transistors. Second, the super-PTAT current source is constructed using a novel architecture that generates a 240% PTAT current slope with excellent stability and very good linearity. Third, in one embodiment, a novel dual-differential-input instrumentation amplifier is used as the input stage of the linear comparator and a very fast, low power linear comparator with nearly perfect channel matching is realized. Lastly, the voltage ramp generator operates with temperature dependant charge/discharge rates that compensate for changes in comparator delay with equal and opposing changes in charging currents and charging time. These novel features allow the clock generator circuit of the present invention to provide a clock signal having very stable frequency over temperature, power supply and process variations.

According to another aspect of the present invention, a super-PTAT current source receives a PTAT reference voltage as input. The PTAT reference voltage is combined with the gate-to-source voltage difference of two unequal-area input transistors and the combined voltage is imposed on a high negative temperature coefficient resistor to produce an output current that is super-PTAT. A current source supplies a bias current to the super-PTAT current source whereby excess current provided by the current source is consumed by closed loop adjustments. The super-PTAT current source generates a super-PTAT current having a constant slope, excellent stability and very good linearity.

In one embodiment, the super-PTAT output current is mixed with a sub-PTAT current to generate a set of currents having exactly the desired TC. The set of combined currents typically remain super-PTAT. The set of combined currents can be used as the charging and discharging currents for the voltage ramp generator of the clock generator circuit for canceling out the TC of the linear comparator delay, thereby rendering the clock signal generated by the clock generator circuit temperature independent.

According to another aspect of the present invention, a dual-channel instrumentation amplifier includes two identical channels of PMOS transistor differential pairs which are configured in a Y-connection and cross-coupled to two diode-connected NMOS current combining load transistors. Each input channel has a non-linear voltage-current characteristic. But when the differential currents cancel at the NMOS transistor load diodes, both input channels have the same differential input voltage, regardless of any shared non-linearity. As thus configured, a high accuracy instrumentation amplifier which operates in current mode is realized with excellent DC matching and high common mode rejection ratio.

According to yet another aspect of the present invention, a linear comparator is formed using the dual-channel instrumentation amplifier as the input stage. The linear comparator thus operates to compare a first pair of differential input signals Vin1 and a second pair of differential input signals Vin2 and provide an output signal being a high gain multiplication of the voltage difference between voltage Vin1 and voltage Vin2. When the linear comparator is applied in the clock generator circuit of the present invention, the two opposite phase switching voltage reference signals are provided as the differential input signals to the first channel as the first input voltage. The voltage ramp signal and one of the switching voltage reference signals are provided as input signals to the second channel as the second input voltage. The dual-channel instrumentation amplifier of the present invention allows the linear comparator to operate at a high rate of speed with excellent channel matching.

The detail construction of the clock generator circuit and its components, including the novel super-PTAT current source and the novel dual-channel instrumentation amplifier, will be described in more details below.

Clock Requirements

Analog-to-Digital Converters (ADCs) always need a clock to operate. Many high speed ADCs require an external clock, usually of high precision, to perform to specification. There are applications that employ embedded ADCs that are expected to work stand alone, without any external clock required. In such cases, an internal clock must be generated on-chip, that is, on the integrated circuit on which the ADC is embedded.

For some ADC circuits, the accuracy of the internal clock is sometimes not critical. Some ADC can meet parametric requirements with loose tolerance on the clock. That is the clock frequency can change over +/−30–40% and the ADC circuit can still meet performance specification. But there are many applications that require that the frequency generated by the internal clock be quite stable. In these ADC circuits, the clock frequency has a major impact affecting the parametric performance of the ADC circuit. The more the clock frequency can be made not to vary, the more accurate the ADC can be.

The three main causes of clock instability are temperature, process and power supply (Vdd) variations from nominal. Together with other smaller contributors to frequency instability, or frequency variations, the individual sources of error combine to produce an overall envelope of possible frequencies. Typically, it is standard practice to plot clock frequency against temperature, and overlay results from different combinations of Vdd and process variations. The final bundle of curves characteristically takes on the shape of a bowtie; that is to say that all of the individual error sources, including the temperature dependent errors, combine to create a band of probable worst case positive and negative frequency errors at nominal temperature, and this band tends to widen out as temperature is changed, in either direction, from nominal.

In some special applications, there may be a direct one-to-one correspondence between frequency and another variable such as current. A specific example of such an application would be a design that contains a highly accurate charge pump on chip whose charge per unit time, $\partial Q/\partial t$, which equivalently is the average current supplied by the charge pump ($\partial Q/\partial t \sim I\_avg$), must be insensitive to process and Vdd changes. In such a system, the clock frequency has a direct linear effect on I_avg because the $\partial t$ term is inversely proportional to the clock frequency (Fclock). Since $1/\partial t = Fclock$, the value of I_avg is then proportional to $\partial Q*Fclock$. Additionally, when $\partial Q/\partial T$ is not zero, $\partial Q/\partial T$ must equal $\partial I\_avg/\partial T$, which, in turn, makes $\partial Fclock/\partial T$ equals to zero and Fclock is temperature insensitive. Obviously, Fclock must have errors smaller than the overall error budget for I_avg in order for I_avg to remain within its error boundaries.

Therefore, it is often desirable for a clock generator circuit to generate a clock signal that can meet the stringent requirements of the underlying application.

Clock Generator Circuit Overview

FIG. 1 is a schematic diagram of a digitizing temperature sensor system in which the clock generator circuit can be incorporated. In the present illustration, the clock generator circuit of the present invention is incorporated in a digitizing temperature sensor system 10 for providing clock signals to the digitizing temperature sensor system. Referring to FIG. 1, digitizing temperature sensor system 10 is built as an integrated circuit and a clock generator circuit 14 is incorporated for generating the system clock and other clock signals for the integrated circuit. Digitizing temperature sensor system 10 includes a temperature sensing element, such as a diode, built into the integrated circuit for providing temperature measurements. In the present illustration, the temperature sensing diode is included in a circuit block 18 and a terminal 30 on circuit block 18 provides the VBE voltage of the temperature sensing diode. Digitizing temperature sensor system 10 also includes a power-on reset circuit 12 and a delta-VBE test circuit 16. Delta-VBE test circuit 16 is included for synchronously sampling the VBE voltage so as to measure the delta-VBE ($\Delta V_{BE}$) voltage of the on-chip diode. The delta-VBE voltage can then be used to calculate the chip temperature of the integrated circuit. In digitizing temperature sensor system 10, power-on reset circuit 12 monitors the Vdd voltage to detect Vdd conditions that may require resetting of the analog and digital circuitry on the integrated circuit. Clock generator circuit 14 generates the clock signals necessary for driving all the functional blocks of digitizing temperature sensor system 10.

FIG. 1 is illustrative of one application in which the clock generator circuit of the present invention can be incorporated. In practice, the clock generator circuit of the present invention can be incorporated in any integrated circuit, including but not limited to a digitizing temperature sensor system, for generating the necessary clock signals. The clock generator circuit of the present invention is basically a stand alone circuit block coupled to the Vdd voltage and providing one or more clock signals that can be connected to any desired circuitry in the integrated circuit in which the clock generator circuit is incorporated.

Figure 2:
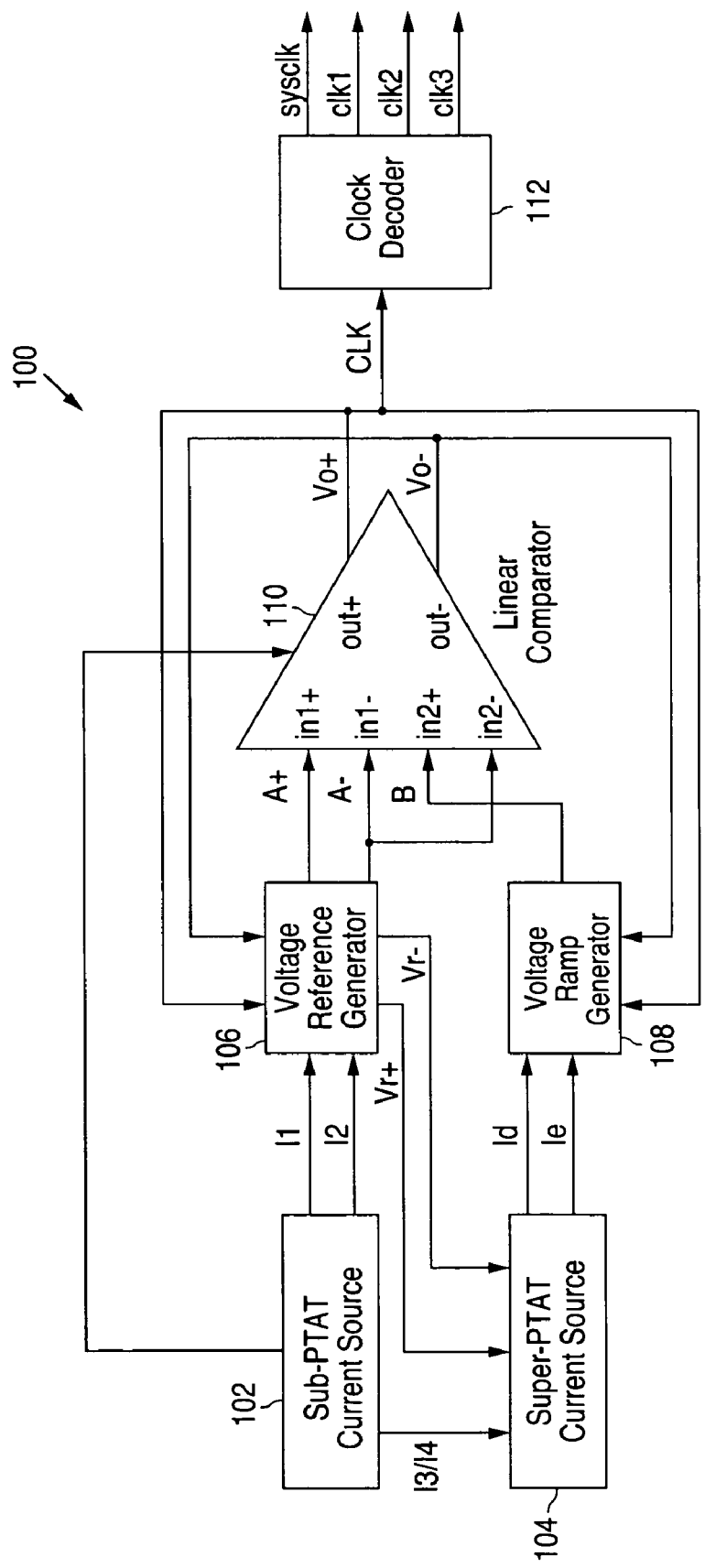
FIG. 2 is a block diagram of a clock generator circuit according to one embodiment of the present invention.

FIG. 2 is a block diagram of a clock generator circuit according to one embodiment of the present invention. The clock generator circuit is sometimes referred to as an internal clock generator circuit or an on-chip clock generator circuit as the entire circuit can be integrated in an integrated circuit for generating the required clock signal internally or on-chip.

Referring to FIG. 2, a clock generator circuit 100 includes six functional blocks which operate together to generate a highly frequency stable clock signal CLK. In the present embodiment, the six functional blocks include: 1) a sub-PTAT current source 102, 2) a super-PTAT current source 104, 3) a voltage reference generator 106, 4) a voltage ramp generator 108, 5) a linear comparator 110 and 6) a clock decoder 112.

Sub-PTAT current source 102 provides bias currents for various functional blocks of clock generator circuit 100. In one embodiment, sub-PTAT current source 102 generates a sub-PTAT current with constant temperature coefficient (TC) based on a PTAT reference voltage imposed on a resistor with a partially PTAT temperature coefficient (TC). Specifically, sub-PTAT current source 102 provides sub-PTAT currents I1 and I2 to voltage reference generator. Sub-PTAT current source 102 also provides sub-PTAT currents I3 and I4 to super-PTAT current source. Finally, sub-PTAT current source 102 provides sub-PTAT currents I5 and I6 to linear comparator 110. In other embodiments, the bias currents provided by current source 102 can be a PTAT current or a current with other temperature coefficient. The use of a sub-PTAT current as the basis of the bias currents in clock generator circuit 100 is illustrative only.

Voltage reference generator 106 generates a set of reference voltages Vr+ and Vr− using the sub-PTAT currents I1 and I2 from sub-PTAT current source 102. The difference between reference voltages Vr+ and Vr− is a PTAT voltage Vref1 (i.e. Vr+−Vr−=Vref1). The set of reference voltages Vr+ and Vr− is provided as inputs to the super-PTAT Current Source. In addition, voltage reference generator 106, under the control of a pair of feedback signals from linear comparator 110, generates a set of switching reference voltage signals A+ and A−. Specifically, output voltages Vo+ and Vo− of linear comparator 110 are coupled to control voltage reference generator 106 for generating the pair of switching reference voltage signals A+ and A−. Switching reference voltage signals A+ and A− have opposite phase and a magnitude equal to Vref1 (Vr+−Vr−). Switching reference voltage signals A+ and A− are provided as input signals to linear comparator 110, forming a first feedback loop in clock generator circuit 100.

Super-PTAT current source 104 generates a super-PTAT current based on sub-PTAT current I3 from sub-PTAT current source 102 and reference voltages Vr+ and Vr− from voltage reference generator 106. In one embodiment, a super-PTAT current that is 240% PTAT is generated. Furthermore, in accordance with the present invention, the super-PTAT current generated by super-PTAT current source 104 is mixed with sub-PTAT current I4 provided by sub-PTAT current source 102 to provide a set of currents Id and Ie which are used to form the charging and discharging currents for the voltage ramp generator. In the present embodiment, the charging and discharging currents remain super-PTAT, that is, the resulting mixed currents still retain a temperature coefficient slope greater than 100% PTAT. However, in other embodiments, other sub-PTAT and super-PTAT current combination can be used and the resulting mixed currents can have any desired temperature coefficient including sub-PTAT, PTAT and super-PTAT.

The charging and discharging currents thus generated can be used advantageously for compensating the delay through the linear comparator where such delay typically has a variation that is not linear with respect to temperature. The non-linear temperature coefficient of the comparator delay is generally very difficult to compensate and therefore leads to temperature dependent errors in the clock frequency. By using the appropriate mixing of sub-PTAT and super-PTAT currents in super-PTAT current source 104, the temperature coefficient of the charging and discharging currents is selected so as to normally cancel out the variations in the comparator delay due to temperature.

Voltage ramp generator 108 receives currents Id and Ie which are derived from the combined sub-PTAT current and super-PTAT current in super-PTAT current source 104. Voltage ramp generator 108 also receives feedback signals from linear comparator 110. Specifically, output voltages Vo+ and Vo− of linear comparator 110 are coupled to control voltage ramp generator 108 for generating a voltage ramp signal B. Voltage ramp signal B is provided as an input signal to linear comparator 110, forming a second feedback loop in clock generator circuit 100. Voltage ramp signal B is a triangular ramp signal generated by the charging and discharging of a capacitor in the voltage ramp generator circuit. The repeating cycles of oscillation resulted from the feedback signals Vo+ and Vo− toggles the charging and discharging currents provided to the capacitor between a value of charging current I_up where I_up=Id−Ie and a value of discharging current I_dn where I_dn=Ie, creating a nearly ideal triangle waveform as voltage ramp signal B.

In the embodiment shown in FIG. 2, linear comparator 110 is implemented using a four-input linear comparator including a novel dual-differential-input (dual-channel) instrumentation amplifier as the comparator input stage. In other embodiments, linear comparator 110 can be implemented using other linear comparator circuits, currently known or to be developed. Alternate embodiments of the clock generator circuit of the present invention using other linear comparator circuits will be, described in more detail below. However, the four-input linear comparator with a dual-channel instrumentation amplifier input stage realizes self-correcting error behavior that provides particular advantages when applied in the clock generator circuit of the present invention.

In the present description, the term "linear comparator" refers to a comparator circuit that does not use a clock signal to operate and does not include an internal synchronization circuit to generate a clock signal. A linear comparator operates to compare two input signals and amplify small differences in the input signals into large output values. Typically, a linear comparator includes multiple gain stages configured in a cascode manner to amplify small amplitude signals (such as 100 µV) to large output values (such as 5 volts). In contrast to a linear comparator, a strobe comparator operates to make comparison decisions synchronous with a clock signal. While strobe comparators typically operate faster than a linear comparator, it is not possible to use a strobe comparator circuit in a clock generator circuit since the clock signal required by the strobe comparator itself is not yet generated. In accordance with the present invention, a dual-channel instrumentation amplifier operating in the current mode is incorporated in the linear comparator to provide fast signal switching rate, thereby enabling the linear comparator to operate at a fast speed.

Referring to FIG. 2, linear comparator 110 includes two input channels. The first input channel in1+ and in1− receives switching voltage reference signals A+ and A− as differential input signals. The second input channel in2+ and in2− receives voltage ramp signal B and switching voltage reference signal A− as input signals to be compared. Linear comparator 110 is biased by sub-PTAT currents I5 and I6 from sub-PTAT current source 102 and provides switching output signals Vo+ and Vo− as output signals. In the present embodiment, the Vo+ signal is used as the clock signal CLK and is coupled to clock decoder 112 for generating multi-phase clock signals that can be used for all of the circuits in the integrated circuit in which the clock generator circuit is incorporated. In the present embodiment, clock decoder 112 is a three-phase clock decoder. Thus, clock decoder 112 provides a system clock (sysclk) signal as well as clock signals clk1, clk2 and clk3. It is understood that, depending on the application, the clock decoder can be configured as an n-phase clock decoder to generate the necessary clock signals of any desired phase shift from the input clock signal CLK, said decoded clock phases having an overall period of n/Fclk, where Fclk is the frequency of the clock signal CLK.

As mentioned above, the output signals Vo+ and Vo− of the linear comparator are coupled as feedback signals to voltage reference generator 106 and voltage ramp generator 108 to form a first and second feedback control loops for controlling the switching of input signals A+, A− and B.

Clock Generator Circuit Operation Theory

The clock generator circuit of the present invention is able to generate a clock signal that is stable over process variations. The stability of the clock signal can be demonstrated as follows. In one embodiment, first, in the voltage ramp generator, current Id is 2*Ie. The charging current I_up equals to (Id−Ie), which is Ie. The discharging current I_dn equals to Ie. The period Tclk of the clock signal with zero comparator delay is given as: Tclk=Qc/I_dn+Qc/I_up=2*Qc/Ie=2*C*Vref_eff/Ie, where Vref_eff is the PTAT reference voltage, C is the charging/discharging capacitor. As described above, currents I1 and I2 driving the voltage reference generator and current I3 driving the super-PTAT current source are mirrored from the current I0 of the sub-PTAT current source. In the sub-PTAT current source, a PTAT reference voltage (Vref0) is imposed on a resistor ($R_{Ref}$) with partially PTAT TC to create the foundation current I0 with a constant TC. Currents Id and Ie can be described as a weighted sum of a sub-PTAT current and a super-PTAT current.

Due to process variations, the threshold voltage of the NMOS or PMOS transistors making up the voltage reference generator circuit will vary, causing changes in the reference voltage "Vref0" in the sub-PTAT current source circuit 102 and thus the foundation of the sub-PTAT current I0 from which currents I1–I4 are derived. When voltage Vref0 goes up, current I0 goes up, and currents I1–I4 will go up too. At the same time, voltage Vref_eff will track Vref0 and go up and charge Qc will go up. Currents Id and Ie will track currents i3 and I4 and go up, too. As both Vref_eff and Ie will go up, so Tclk is left unchanged. Similarly, when voltage Vref0 goes down, current I0 goes down, and currents I1–I4 will go down too. At the same time, voltage Vref_eff will go down and charge Qc will go down. Currents Id and Ie will track currents I3 and I4 and go down as well. As both Vref_eff and Ie will go down, so clock period Tclk is again left unchanged. In this manner, the clock period is made to be independent of process variations causing variations in the threshold voltage of the transistors.

The operation theory of the clock generator circuit can be described in detail as follows. The definitions of the variables used are as follows:

| | |
|---|---|
| T | time period of the clock, from which the multi-phase non-overlapping clock signals are generated; |
| $T_{hi}$, $T_{lo}$ | time period when the clock logic is "hi" or "lo"; |
| $T_{d1}$, $T_{d2}$ | comparator propagation delays at two different timing edges: falling edge and rising edge; |
| $C_2$ | input capacitor to the voltage ramp generator; |
| I_up, I_dn | charging/discharging currents to capacitor $C_2$; |
| V_up, V_dn | Capacitor $C_2$ ramping-up/ramping-down voltage excursions; |
| Vref1 | Voltage difference between Vr+ and Vr−. It equals to the PTAT reference voltage Vref0 in sub-PTAT current source. |

The clock time period can be defined as follows:

$$T = C_2 * \left( \frac{\text{V\_up}}{\text{I\_up}} + \frac{\text{V\_dn}}{\text{I\_dn}} \right), \frac{T_{hi}}{T_{lo}} = \frac{\text{V\_up}}{\text{V\_dn}} * \frac{\text{I\_dn}}{\text{I\_up}};$$

Because V_up=V_dn=V,
Then $$\frac{T_{hi}}{T_{lo}} = \frac{\text{I\_dn}}{\text{I\_up}} = D.$$

Assume I_up=I, $$T = C_2 * \left( \frac{V}{\text{I\_up}} + \frac{V}{\text{I\_dn}} \right) = C_2 * \left( \frac{V}{I} + \frac{V}{D*I} \right) = \frac{C_2 * V}{I} * \left( 1 + \frac{1}{D} \right).$$

In one embodiment, $$V = \text{Vref\_eff} = 3 * Vref1 + V_{overshoot} + V_{undershoot}$$
$$= 3 * Vref1 + \frac{\text{I\_up} * T_{d1}}{C_2} + \frac{\text{I\_dn} * T_{d2}}{C_2}$$
$$= 3 * Vref1 + \frac{I}{C_2} * (T_{d1} + D * T_{d2});$$

$$T = \frac{C_2}{I} * \left[ 3 * Vref1 + \frac{I}{C_2} * (T_{d1} + D * T_{d2}) \right] * \left( 1 + \frac{1}{D} \right); \text{ and}$$

$$T = \left[ \frac{3 * C_2 * Vref1}{I} + (T_{d1} + D * T_{d2}) \right] * \left( 1 + \frac{1}{D} \right).$$

The equation for the clock period can be simplified by assuming certain operating conditions:

If $T_{d1} \approx T_{d2} = T_d$, then $$T = \frac{3 * C_2 * Vref1}{I} * \left( 1 + \frac{1}{D} \right) + \frac{(1+D)^2}{D} * T_d;$$

Furthermore,
If $T_{hi} = T_{lo}$, then D=1

$$T = \frac{6 * C_2 * Vref1}{I} + 4 * T_d;$$

If $T_{hi} = 3 * T_{lo}$, then D=3

$$T = \frac{4 * C_2 * Vref1}{I} + 5.33 * T_d;$$

If $T_{hi} = \frac{1}{3} * T_{lo}$, then $D = \frac{1}{3}$ $$T = \frac{12 * C_2 * Vref1}{I} + 5.33 * T_d.$$

Thus, for a 50% duty cycle, $T_{hi} = T_{lo}$ and D=1, the time period is given by the equation above:

$$T = \left( \frac{6 * C2 * Vref1}{I} \right) + 4 * Td.$$

Then, if the desired clock frequency is 600 kHz, the desired clock period is 1.67 μs, D=1, Vref1 is 93 mV and I is 0.5 μA, then for the ideal case where the comparator delay is zero, the capacitance of the input capacitor $C_2$ should be 1.496 pF. When the comparator delay is about 100 ns, the capacitance of the input capacitor C2 should be 1.13 pF. As shown in the equation above, the clock period T is a function of the Vref_eff voltage and the capacitance of capacitor $C_2$. The clock period T can be made longer by either increasing the capacitance of capacitor $C_2$ or increasing the amount of reference voltage Vref_eff being applied. However, in some situations, it is not practical to form a large capacitor in the integrated circuit. In accordance with the present invention, multiple Vref1 voltages are provided to the linear comparator as the reference voltage to enable a longer clock period while using a small capacitance value for capacitor $C_2$.

Because Vref1 is a PTAT reference voltage, if the delay time of the comparator increases as the temperature goes up, a carefully-chosen super-PTAT current is needed to create a stable clock signal with zero TC. Therefore, in accordance with the present invention, the charging and discharging currents of capacitor C2 are selected to have the exact temperature coefficient for compensation for the temperature coefficient of the comparator delay.

The construction of each functional block in clock generator circuit 100 will now be described in detail.

Sub-PTAT Current Source

In clock generator circuit 100, sub-PTAT current source 102 provides the bias currents for the functional blocks of the clock generator circuit. The sub-PTAT current source is based on a PTAT reference voltage (Vref0) imposed on a resistor ($R_{Ref}$) with partially PTAT positive temperature coefficient (TC) to create an output current with a constant TC. In the present embodiment, the current slope of the output current is about 70% PTAT. The output current is referred to herein as a "sub-PTAT" current as the current increases more slowly than 1:1 with respect to temperature. The sub-PTAT current source should be a precision constant or near constant temperature coefficient current source with high power supply rejection ratio (PSRR). A precision current source with high PSRR is described in copending and commonly assigned U.S. patent application Ser. No. 10/402,447, entitled "A Constant Temperature Coefficient Self-Regulating CMOS Current Source," of Peter R. Holloway et al., filed Mar. 27, 2003, which patent application is incorporated herein by reference in its entirety. The current source described in the aforementioned patent application can be used to implement the sub-PTAT current source in the clock generator circuit of the present invention. The final temperature coefficient of the output current of the sub-PTAT current source can be modified by using a reference resistor $R_{Ref}$ having the desired temperature coefficient.

In the present embodiment, current source 102 is a sub-PTAT current source providing a sub-PTAT current for generating the bias currents for the functional blocks of the clock generator circuit. The use of a "sub-PTAT" current source as current source 102 in the present embodiment is illustrative only. In other embodiments, current source 102 can be any precision current source providing a constant or near constant temperature coefficient output current. For instance, a resistor with the appropriate positive or negative or zero temperature coefficient can be used in current source 102 to generate an output current having either sub-PTAT, PTAT, or super-PTAT characteristics. The use of a "sub-PTAT" current source as current source 102 in the clock generator circuit of the present invention is not intended to be limiting. Current source 102 can in fact be any precision current source providing a constant or near constant temperature coefficient output current.

Voltage Reference Generator

FIG. 3 is a circuit diagram of a voltage reference generator which can be incorporated in the clock generator circuit of FIG. 2 according to one embodiment of the present invention. Referring to FIG. 3, voltage reference generator 106 includes a pair of diode-connected NMOS transistors M1 and M2. Transistors M1 and M2 have an area ratio of 6:1. Transistors M1 and M2 receive sub-PTAT currents from sub-PTAT current source 102 and operate to generate a set of DC voltages that duplicates the PTAT reference voltage of the sub-PTAT current source. Specifically, the drain/gate terminal of transistor M1 is biased by a current I1 which is a sub-PTAT current from sub-PTAT current source 102. A voltage Vr− is generated at the drain terminal of transistor M1. On the other hand, the drain/gate terminal of transistor M2 is biased by a current I2 which is also a sub-PTAT current from sub-PTAT current source 102. A voltage Vr+ is generated at the drain terminal of transistor M2. The voltage difference between Vr+ and Vr− is the PTAT reference voltage Vref1. By mirroring current values (I1 and I2) and transistor sizes (M1 and M2) to those in sub-PTAT current source 102, Vref1 is set to be equal to Vref0. In clock generator circuit 100 (FIG. 2), the DC voltages Vr+ and Vr− are provided to super-PTAT current source 104 for generating the super-PTAT current.

In voltage reference generator 106, an output node 322 is switchably connected to voltages Vr− and Vr+ through a pair of switches S1 and S2, respectively. Switches S1 and S2 are controlled by switching voltages Vo+ and Vo− respectively which are the output voltages from linear comparator 110. Through the switching action of switches S1 and S2, the switching voltage reference signal A− is generated at output node 322. Switching voltage reference signal A− switches from the Vr− voltage to the Vr+ voltage and thus has a voltage amplitude of the PTAT reference voltage Vref1.

Voltage reference generator 106 also includes an output node 324 providing the switching voltage reference signal A+. Specifically, output node 324 is switchably connected to voltages Vr− and Vr+ through a pair of switches S3 and S4, respectively. Switches S3 and S4 are controlled by switching voltages Vo− and Vo+ respectively. Through the switching action of switches S3 and S4, the switching voltage reference signal A+ is generated at output node 324. Switching voltage reference signal A+ switches from the Vr− voltage to the Vr+ voltage and has a voltage amplitude of the PTAT reference voltage Vref1. Switching voltage reference signal A+ has an opposite phase as switching voltage reference signal A− as the switches associated with the two signals are controlled by opposite voltages Vo− and Vo+.

FIG. 4, which includes FIGS. 4A to 4D, includes waveforms illustrating the operation of the voltage reference generator circuit of FIG. 3. As shown in FIGS. 4A and 4B, switching voltage reference signals A+ and A− are in opposite phase and switch between a Vr− voltage of approximately 730 mV and a Vr+ voltage of approximately 823 mV. Furthermore, switching voltage reference signals A+ and A− switch states in response to and synchronous with voltages Vo+ and Vo− (FIGS. 4C and 4D) which are also in opposite phase.

The embodiment of voltage reference generator 106 shown in FIG. 3 is illustrative only. One of ordinary skill in the art would appreciate that other configurations of the voltage reference generator circuit are possible for generating the necessary reference voltages and switching voltage reference signals. Alternate embodiments of the voltage reference generator circuit will be described below.

Super-PTAT Current Source

FIG. 5 is a circuit diagram of a super-PTAT current source according to one embodiment of the present invention. FIG. 6, which includes FIGS. 6A to 6C, includes transient simulation waveforms of voltages V1, V2, Vr+, Vr− and currents Ia, Ib and Ic of the super-PTAT current source of FIG. 5 during initial startup conditions. FIG. 7, which includes FIGS. 7A and 7B, includes temperature sweep simulation waveforms of current I3 and the currents Ia, Ib and Ic in the super-PTAT current source of FIG. 5. FIG. 8, which includes FIGS. 8A and 8B, are temperature sweep simulation waveforms of the output current Iout1 and the derivative of the current Iout1 of the super-PTAT current source of FIG. 5.

In FIG. 5, super-PTAT current source 504 represents a part of the circuitry used to form super-PTAT current source 104 of FIG. 2. Specifically, super-PTAT current source 504 includes the circuitry for generating an output current Iout1 that is super-PTAT. Super-PTAT current source 104 of FIG. 2 includes super-PTAT current source 504 and additional current mixing circuitry for providing an output current Iout2 having the desired temperature coefficient, as will be explained in more detail below.

Referring first to FIG. 5, super-PTAT current source 504 includes a current source 532 coupled between a power supply voltage (such as Vdd) and a node 530. Current source 532 supplies a bias current I3 to circuit branches connected to node 530. In one embodiment, current I3 is a sub-PTAT current generated by a sub-PTAT current source and current source 532 is merely a current mirror mirroring the output current of the sub-PTAT current source. Bias current I3 should be large enough to supply the current branches of super-PTAT current source 504 with additional current to throw away for close loop error adjustment, as will be explained in more detail below.

In the present embodiment, super-PTAT current source 504 includes a pair of PMOS transistors M3 and M4 in respective first and second circuit branches drawing respective currents Ic and Ib from node 530. Transistors M3 and M4 are biased by respective reference voltages Vr+ and Vr−. Specifically, reference voltage Vr+ drives the gate terminal of transistor M3 while reference voltage Vr− drives the gate terminal of transistor M4. Transistors M3 and M4 are of unequal area. In the present embodiment, PMOS transistor M4 is twice as large as PMOS transistor M3. A resistor R1 is connected in series with PMOS transistor M4 between node 530 and node 534. A current mirror formed by NMOS transistor M5 and diode connected NMOS transistor M6 is coupled to the drain terminals of PMOS transistors M3 and M4. Specifically, the drain terminal of transistor M5 (node 536) is connected to the drain terminal of PMOS transistor M3 while the drain terminal of transistor M6 (node 534) is connected to the drain terminal of PMOS transistor M4. A voltage V1 is established at node 534 while a voltage V2 is established at node 536. In steady state, voltage V1 is normally close to or equal to voltage V2, but V2 will vary in such a way to control current Ia to force currents Ib and Ic to be equal where Ib=Ic=(I3−Ia)/2.

As thus configured, a voltage equal to the sum of (Vr+−Vr−), or Vref1, and (Vgs3−Vgs4), or ΔVgs, of transistors M3 and M4, is impressed across resistor R1. The combined voltage, VR1, is a PTAT voltage. When the temperature coefficient of resistor R1 has a very negative TC, the current Ic flowing in the first circuit branch of transistor M4 is super proportional to absolute temperature. Because of the current mirror of transistors M5 and M6, current Ib flowing in the second circuit branch of transistor M3 is equal to current Ic.

Super-PTAT current source 504 further includes a third circuit branch including serially connected PMOS transistor M8 and NMOS transistor M7 between node 530 and a power supply voltage, such as the ground node. A current Ia flows through the third circuit branch. Transistor M7 is controlled by voltage V2 while transistor M8 is diode connected. Transistor M7, under the control of voltage V2, acts as a shunt regulator operating to divert sufficient current from current i3 to keep the voltage at node 530 regulated at a desired voltage level.

In the present embodiment, regulation of the voltage at node 530 is provided by a shunt regulator in the form of a NMOS transistor M7. However, the use of transistor M7 as a shunt regulator is illustrative only and in other embodiments, other means for regulating the voltage at node 530 using voltage V2 from the second circuit branch can be used. For instance, transistors M7 and M8 can be replaced by an operational amplifier or a vertical NPN bipolar transistor.

In the present embodiment, super-PTAT current source 504 further includes a capacitor C1 coupled between node 536 (the drain terminal of transistor M5) and node 538 (the drain terminal of transistor M7) to filter out noise at the voltage V2 and to compensate the frequency of the closed-loop system. Furthermore, super-PTAT current source includes reset switches coupled to discharge voltage V2 and voltage V1. It is understood that capacitor C1 and the reset switches are optional components of super-PTAT current source 504.

The output current Iout1 of super-PTAT current source 504 is provided at an output terminal 540. Output current Iout1 is generated by serially connected NMOS transistors M9 and M10 whose current is defined by a current mirror formed by transistor M6 and transistor M9. For reasonable values of resistive loading Rload that may be coupled to output terminal 540, defined as values of Rload such that the voltage at the output drain terminal of transistor M10 (node 540) is within the voltage compliance range of the current source, the output current Iout1 is independent of the value of Rload. Transistors M6 and M9 can be equally sized devices or may have another fixed size ratio. Because they have equal gate-to-source ($V_{GS}$) voltages, the super-PTAT current (current Ic) flowing in transistor M6 is mirrored to transistor M9 to provide a super-PTAT output current having constant temperature coefficient. NMOS transistor M10, formed as a cascode output buffer device, is connected between output terminal 540 of the current source and the drain terminal of transistor M9. Cascode transistor M10 is biased by the regulated voltage at node 530 and functions to increase the output impedance of current source 504 and further decrease the supply voltage dependence of output current Iout1. Specifically, transistor M10 isolates the drain voltage at transistor M9 from any change in the Vdd voltage. In this manner, the output current generated by super-PTAT current source 504 remains independent of variation in the supply voltage Vdd.

The effect of the PTAT voltages (Vref1+ΔVgs) imposed on the highly negative TC resistor R1 produces a current in the resistor and transistor M4 (Ic=Ib=Iout1) that is super-PTAT. In one embodiment, a current Ic=Ib=Iout1 being approximately 240% PTAT is generated. Current I3, which biases the super-PTAT current source, is disposed to supply more current than (Ib+Ic) where the excess current is consumed by the closed loop adjustment of current Ia in the third circuit branch.

The operational principles of the super-PTAT current source of FIG. 5 are as follows. Transistors M3 and M4 form the input stage of the current source for receiving the reference voltages Vr+ and Vr−. In one embodiment, voltages Vr+ and Vr− are generated by a voltage reference generator based on bias currents I1 and I2 that are 70% PTAT currents. From the PTAT voltage references of Vref1=(Vr+−Vr−), super-PTAT current source 504 operates to generate an output current that is super-PTAT.

To generate an output current Iout1 that is super-PTAT, resistor R1 is selected to have a negative temperature coefficient. Also, transistors M3 and M4 are made to have unequal area. In the present embodiment, transistors M3 and M4 have a 1:2 area ratio. As thus configured, the source terminal of transistor M4 is more negative than the source terminal of transistor M3, and both devices are operating in the near subthreshold region. As is well understood in the art, in the deep subthreshold region, the MOS transistor is dominated by minority carrier action and behaves like a bipolar transistor. Specifically, when MOS devices are operated at low current density levels and are thus biased in the subthreshold or weak inversion region, the I–V characteristics of the MOS transistors are exponential and exhibit strong temperature dependence. This behavior is still largely dominant even when the transistor is operating in the near subthreshold region. Thus, transistor M4 provides a ΔVgs voltage component that behaves like a $\Delta V_{BE}$ voltage of a bipolar transistor, which always has a PTAT behavior. As a result of the biasing arrangement in super-PTAT current source 504, transistor M4 adds a ΔVgs component to the reference voltage Vref1 formed by voltages Vr+ and Vr− where the reference voltage Vref1 is itself PTAT.

Transistors M3 and M4 operate as an error amplifier to maintain the PTAT reference voltage value across resistor R1 and voltage V2 controls to what degree transistor M7 is to be turned on to regulate the voltage at node 530. Voltage V2 acts to keep current Ib at transistor M3 and current Ic at transistor M4 equal. The total voltage across resistor R1, VR1, which arises from the size ratio of transistors M3 and M4 and the reference voltage, Vref1, combined with the temperature coefficient of resistor R1, generates an output current having a super PTAT characteristics. In other words, as a result of using a negative TC resistor R1 and biasing transistor M4 in near subthreshold region, current Ic flowing in transistor M4 is super proportional to absolute temperature.

When super-PTAT current source 504 is started up, current I3 is provided to the first, second and third circuit branches including transistors M3, M4 and M7. To achieve a stable start-up condition, it is desirable to have the initial current flowing in the first circuit branch (transistor M4) to be stronger than the current flowing in the second circuit branch (transistor M3). Thus, more current should flow in transistor M6 than in transistor M5. Under these initial conditions, the voltage V2 has a value that turns off transistor M7 so that all the available current goes into transistors M3 and M4 until they reach equilibrium.

Current I3 is a DC current source and in one embodiment, is generated by a sub-PTAT current source as described above. The value of current I3 is chosen to be greater than the sum of the currents through transistors M3 and M4 so that there can be extra current to throw away at transistor M7 to achieve closed loop control.

Referring now to FIG. 6 which illustrates the behavior of the voltages and currents in super-PTAT current source 504 during the start-up phase of the circuit in one embodiment of the present invention. During start up, voltages Vr+ and Vr− (FIG. 6B) rise from 0 volts to their respective Vr+ and Vr− values where the difference is the PTAT reference voltage Vref1. As the circuit finalizes the start-up phase, voltage V1 and voltage V2 (FIG. 6A) rise to their equilibrium value of around 755 mV and currents Ib and Ic (FIG. 6C) settle at 1 uA of current. In steady state, current Ia (FIG. 6C) draws 2 uA of current out of current I3 so that current I3 should have a total current of at least 4 uA.

Using the super-PTAT current source of the present invention, a super-PTAT current (that is, the output current increasing more quickly than 1:1 with respect to temperature can be generated even when an input reference current that is sub-PTAT is used to supply the super-PTAT current source. This result is illustrated in FIG. 7 where a current I3 (FIG. 7A) having 70% PTAT value is used to supply the super-PTAT current source. The resultant currents Ib and Ic (FIG. 7B) have a 240% PTAT characteristics. FIG. 8 illustrates the behavior of current Iout1 generated from current Ic. As shown in FIG. 8B, current Iout1 has an average equivalent slope of 240% PTAT. FIG. 8A illustrates the slope of current Iout1 and ideally should be a flat line to indicate a constant TC. In the present simulation, a slight non-linear slope error is generated due to resistor R1 having a strong second order temperature coefficient.

In the embodiment shown in FIG. 5, the output current Iout1 is sunk by transistors M9 and M10 through the use of a current mirror at transistors M6 and M9. In other embodiments, the output current of the current source can be sourced from the regulator voltage node instead. In one embodiment, the output current is sourced from the current source by reflecting current Ic through a PMOS current mirror. For instance, a PMOS current mirror can be coupled to output node 540 to reflect current Iout1 which is mirrored from current Ic. The PMOS current mirror can include a first PMOS transistor being diode connected and a second PMOS transistor providing the mirrored current. The source terminal of the first PMOS transistor is connected to the Vdd power supply voltage while the gate and drain terminals are connected to node 540. The second PMOS transistor has a source terminal connected to the Vdd power supply voltage and a gate terminal connected to node 540. The drain terminal of the second PMOS transistor provides the sourced output current.

Mixing Currents to Generate Charging Currents

In accordance with the present invention, the sub-PTAT current generated by the sub-PTAT current source and the super-PTAT current generated by the super-PTAT current source will be used in conjunction for canceling out the delay of the linear comparator in the clock generator circuit of the present invention. Specifically, in the clock generator circuit, the linear comparator's reference voltage, which is 3*Vref1, is perfectly PTAT. For an ideal case, a charging current for the voltage ramp generator that is also 100% PTAT would result in the two temperature coefficients canceling each other perfectly. In practice, the delay caused by the linear comparator extends the triangular wave ramp signal generated by the voltage ramp generator past its desired turning point and this delay varies with temperature. Knowing the temperature dependent characteristic of the delay of the comparator, the charging current for the voltage ramp generator can be set to have a temperature coefficient that can effectively cancel out the effect of the temperature dependent delay variation. For example, in one embodiment, a charging/discharging current temperature coefficient of about 123% PTAT almost perfectly cancels out the effect of the comparator delays over temperature.

In accordance with the present invention, a set of charging and discharging currents is generated using a ratioed mix of sub-PTAT and super-PTAT currents so that a specific temperature coefficient for the charging and discharging currents is selected. When the set of charging and discharging currents is used in the clock generator circuit of the present invention for generating the voltage ramp signal for the linear comparator, the selected temperature coefficient can be used to exactly cancel out first-order variations in the comparator delay due to temperature.

Figures 9, 10:
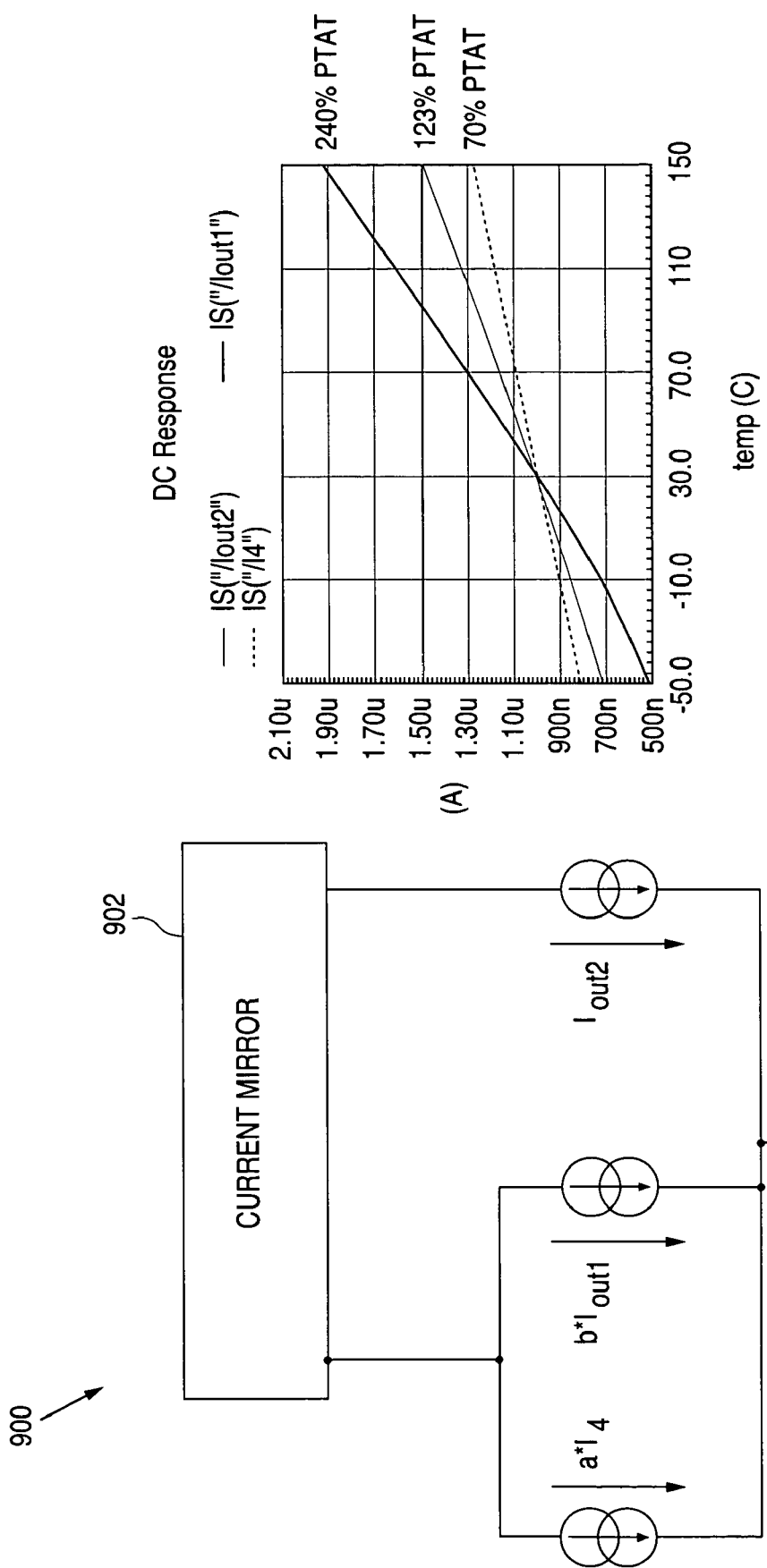
FIG. 9 is a circuit diagram of a current generation circuit which can be incorporated in the super-PTAT current source of the present invention for generating one or more output currents having a desired temperature coefficient.
FIG. 10 includes temperature sweep simulation waveforms illustrating the generation of super-PTAT current Iout2 from the weighted sum of currents I4 and Iout1 in the circuit of FIG. 9.

FIG. 9 is a circuit diagram of a current generation circuit which can be incorporated in the super-PTAT current source of the present invention for generating one or more output currents having a desired temperature coefficient. FIG. 10 includes temperature sweep simulation waveforms illustrating the generation of super-PTAT current Iout2 from the weighted sum of currents I4 and Iout1 in the circuit of FIG. 9.

Referring first to FIG. 9, a current mirror 902 is coupled to receive a sub-PTAT current I4 and a super-PTAT current Iout1. Sub-PTAT current I4 can be provided by sub-PTAT current source 102 in clock generator circuit 100 of FIG. 2. In the present illustration, sub-PTAT current I4 is a 70% PTAT current. Super-PTAT current Iout1 can be generated by super-PTAT current source 504 and in the present illustration, is a 240% PTAT current. Current mirror 902 sums a multiple of sub-PTAT current I4 and a multiple of super-PTAT current Iout1 to generate an output current Iout2 having the desired temperature coefficient. In FIG. 9, current Iout2 is the sum of a*I4 and b*Iout1. With proper choice of coefficients a and b, the resulting temperature slope of the output current Iout2 can be set to the desired temperature coefficient value. In the present illustration, the coefficient a is ⅔ while the coefficient b is ⅓ and output current Iout2 is a 123% PTAT current.

FIG. 10 illustrates the generation of current Iout2 based on sub-PTAT current I4 and super-PTAT current Iout1. Referring to FIG. 10, the 70% sub-PTAT current and the 240% super-PTAT current are combined using the appropriate coefficients so that a 123% PTAT current is generated.

In one embodiment of the clock generator circuit of the present invention, the set of charging and discharging currents for the voltage ramp generator is derived from current Iout2 being 123% PTAT. The 123% PTAT value is selected so as to perfectly cancel out the effect of the comparator's first order delays over temperature.

Voltage Ramp Generator

FIG. 11 is a circuit diagram of a voltage ramp generator according to one embodiment of the present invention. FIG. 12, which includes FIGS. 12A to 12C, includes simulation waveforms of the comparator output voltages Vo+ and Vo− and the ramp voltage output "B" of the voltage ramp generator.

Referring to FIG. 11, voltage ramp generator 108 receives currents Id and Ie from the super-PTAT current source. Current Id is illustrated as a current source 1110 coupled between the Vdd voltage and a node 1102. Current Ie is illustrated as a current source 1112 coupled between a node 1104 and a power supply voltage, such as the ground node. Voltage ramp generator 108 includes an input capacitor C2 coupled between node 1104 and the ground node. A switch S5 is coupled between node 1102 and one plate of input capacitor C2 (node 1104). Switch S5 switchably connect current Id to input capacitor C2. A switch S6 is coupled between node 1102 and a diode connected NMOS transistor M11. Transistor M11 functions as a temporary load for current Id when the current is not connected to input capacitor C2. As thus configured, current source 1112 providing a current Ie is always connected to capacitor C2. When switch S5 is closed and switch S6 is open, only current Id−Ie goes to charge capacitor C2, so the charging current I_up equals to (Id−Ie). As current Id equals to Ie*(1+1/D), where D is the ratio of $T_{hi}$ over $T_{lo}$ ($T_{hi}$ and $T_{lo}$ being the time periods when the clock logic is "hi" and "lo", respectively), charging current I_up is equal to Ie/D. When switch S5 is open and switch S6 is closed, current Id is diverted to diode M11, capacitor C2 is discharged through current source 1112 by current Ie. Thus, the discharging current I_dn equals to current Ie.

Switch S5 and switch S6 are controlled by opposite phase switching signals Vo− and Vo+ to alternately open and close to charge and discharge capacitor C2. A voltage ramp signal B is generated at node 1104 as a result of the charging and discharging of capacitor C2. An optional reset switch can be included between node 1104 and the ground node to discharge capacitor C2 upon reset of the clock generator circuit.

The operation of voltage ramp generator 108 can be explained in detail with reference to the signal waveforms in FIG. 12. Specifically, switching voltages Vo− and Vo+ (FIGS. 12A and 12B), which are the output signals from linear comparator 110 of the clock generator circuit, have opposite phase. In the present embodiment, input capacitor C2 is charged by current I_up when switch S5 is closed due to voltage Vo− having a logical "high" value. Switch S6 is open due to voltage Vo+ having a logical "low" value and thus no current is diverted from current I_up to transistor M11. Voltage ramp signal B thus makes a positive going voltage excursion, forming the rising edge of the triangular wave, as shown in FIG. 12C. Then, when switching voltages Vo− and Vo+ switch states, switch S5 is open to discontinue supplying current Id to capacitor C2 and switch S6 is closed to divert current Id to transistor M11. Meanwhile, without the charging current provided to capacitor C2, current Ie, coupled to node 1104, operates to discharge capacitor C2. Voltage ramp signal B thus makes a negative going voltage excursion, forming the falling edge of the triangular wave, as shown in FIG. 12C. As can be seen in FIG. 12C, a textbook perfect triangular waveform appears across capacitor C2 as the voltage ramp signal B.

The amplitude of voltage ramp signal B is determined by the clock period or the switching rate of the switching voltages Vo− and Vo+ which are generated by the linear comparator. That is, the output signals Vo− and Vo+ of the linear comparator determine when the triangular ramp signal should switch direction. In the present embodiment, under the control of switching voltages Vo− and Vo+, a voltage ramp signal having a voltage amplitude of 3*Vref1 ppk (peak-to-peak) is generated.

In the present embodiment, switching voltages Vo− and Vo+ are configured as active high signals and switch S5 is closed when voltage Vo− is at a logical "high" value. In other embodiments, switching voltages Vo− and Vo+ can be configured as active low signals in which case voltage ramp signal B will have a rising ramp edge during the logical "low" phase of the Vo− signal.

In the present embodiment, current I_up is related to current I_dn as follows: Id=Ie*(1+1/D), where D is the ratio of $T_{hi}$ to $T_{lo}$. Current I_up=Id−Ie and current I_dn=Ie. When D is 1 (50% duty cycle), Id=2*Ie. I_up=Ie, I_dn=Ie.

Linear Comparator

In the clock generator circuit of the present invention, a linear comparator is used to compare a switching voltage reference signal and the voltage ramp signal to generate the switching output signal to be used as the clock signal CLK. In one embodiment, the linear comparator is implemented as a single-channel two-input linear comparator. The linear comparator compares the switching voltage reference signal and the voltage ramp signal to determine when the switching output signal should change states. In the embodiment shown in FIG. 2, the linear comparator in the clock generator circuit is implemented using a novel comparator architecture where the linear comparator incorporates a dual-differential-input (dual-channel) instrumentation amplifier as the comparator input stage. Thus, in the embodiment shown in FIG. 2, the linear comparator is a dual-channel four-input linear comparator.

It is well understood in the art that a conventional linear comparator has only one input port or one input channel receiving two input signals. A conventional linear comparator operates to compare two single-ended voltages applied to each of the input terminals of its single input channel. A conventional linear comparator cannot compare two differential voltage signals.

It is also well understood in the art that a conventional instrumentation amplifier has two input channels each receiving two input signals for a total of four input signals. Thus, an instrumentation amplifier can handle two differential input voltage signals. Differential voltage signals are typically expressed as +Vin/2 and −Vin/2. A key characteristic of an instrumentation amplifier is that the instrumentation amplifier will reject any difference in the common mode voltage of either of its two input channels. Note that the common mode voltage of two differential signals is merely the average of the two differential signals. In other words, a differential signal can be expressed as including two explicit signal voltages (Vcm+Vin/2) and (Vcm−Vin/2) and one implicit signal voltage Vcm. The difference of the two explicit signal voltages is the input voltage Vin.

Thus, in an instrumentation amplifier with two input channels, each input channel receives a pair of differential voltage signals. Thus, the instrumentation amplifier sees at the first input channel an input voltage Vin1 and an associated common mode voltage Vcm1 and at the second input channel an input voltage Vin2 and an associated common mode voltage Vcm2. The hallmark of a "good" instrumentation amplifier is that the final output signal does not depend in any way on either voltage Vcm1 or voltage Vcm2.

An instrumentation amplifier has two modes of operation: closed loop or open loop. A well-designed instrumentation amplifier should possess certain traits. Typically, an instrumentation amplifier should allow both input voltages Vin1 and Vin2 to take on large voltage values, such as between 0 to 0.8*Vdd, without experiencing problems. Also, the linearity and gain of each input channel should be very good. In order to satisfy these required traits, the typical instrumentation amplifier consumes more area and power as compared to a single port comparator.

In most applications, an instrumentation amplifier is used in the closed loop mode. In closed loop operation, one of the input channels functions as the input port receiving the input voltage Vin1, while the other input channel is affected by the output signal of the instrumentation amplifier in such a way as to force the second input channel to have an identical voltage Vin2 as the first input channel. Thus, Vin2=Vin1. Because common mode voltages Vcm1 and Vcm2 can be ignored, the typical function of an instrumentation amplifier is to sense an input voltage Vin1 with an undesirable Vcm1 and "transfer" the input voltage Vin1 to an output voltage Vout=Vin1 where the common mode voltage Vcm of the output voltage is typically 0 volts, but can be other desirable voltage values that is non-zero, such as a PTAT reference voltage.

On the other hand, when an instrumentation amplifier is used in the open loop mode, the instrumentation amplifier functions as a comparator with two input ports. Thus, the output voltage can be described as K*(Vin1−Vin2), where the gain K is a very large number (1,000 to 1,000,000). Obviously, when Vin1 and Vin2 are very close in value, the output of the instrumentation amplifier can change from one extreme to the other as that difference slowly goes through 0 volts.

While conventional instrumentation amplifiers possess many desirable operational traits, the conventional instrumentation amplifiers have several shortcomings. First, the conventional instrumentation amplifiers can be very slow, particularly when the amplifier is frequency compensated for stable closed loop operation. Second, the conventional instrumentation amplifiers are typically much bigger and consume more power because of its needs for extremely high gain and linearity. Finally, the conventional instrumentation amplifiers actually could have more offset voltage because the input channels have to operate over a very large percentage of the power supply voltage. These shortcomings render the conventional instrumentation amplifiers undesirable for use in a clock generator circuit.

According to one aspect of the present invention, a dual-differential-input (dual-channel) instrumentation amplifier which overcomes the aforementioned shortcomings is disclosed. The dual-channel instrumentation amplifier of the present invention is designed to operate with input voltage Vin of modest values, such as ±100 mV or ±200 mV and realizes rejection of the common mode voltages at each input channel. When the dual-channel instrumentation amplifier is operated in the open loop mode to perform a greater than or less than comparison, the amplifier can be operated at a very fast speed as no frequency compensation is required. Furthermore, the instrumentation amplifier can be implemented in smaller area and consumes less power in operation as compared to conventional instrumentation amplifiers. To accomplish these objectives, the dual-channel instrumentation amplifier of the present invention is not made to have high gain or high linearity but rather relies on the benefits of symmetry to obtain high accuracy of comparison results.

In one embodiment, the dual-channel instrumentation amplifier of the present invention includes a first differential pair of PMOS transistors forming the first input channel and a second differential pair of PMOS transistors forming the second input channel where the two PMOS differential pairs are Y-connected. Each of the two input channels has a gain function to the output that is modest in gain, poor in linearity, but extremely symmetrical in these "flaws". Thus, when the input channels have the same voltage at the input terminals, the resulting output current from each input channel's transconductance stage, which has a non-linear dependence on its input voltage, will have nevertheless an equal value due to symmetry. When the two output current components are subtracted from each other, the net difference will always be zero when both input channels see the same input voltage. When operated in the open loop mode, the dual-channel instrumentation amplifier will operate as a comparator and produce an output error current of a positive value if one input channel's input voltage is greater than the input voltage at the other input channel. On the other hand, when that same input channel's input voltage is less than the input voltage at the other input channel, the instrumentation amplifier will produce a negative current error.

According to another aspect of the present invention, a linear comparator incorporates a dual-differential-input (dual-channel) instrumentation amplifier as the comparator input stage. The linear comparator can further include one or more gain stages providing either current gain or voltage gain to develop a switching output voltage having the required voltage swing, such as the voltage swing of a logic gate. The linear comparator can be used in the clock generator circuit of the present invention to generate a switching voltage signal with zero or near zero frequency error. The linear comparator thus formed can be characterized as a zero crossing detector that senses the difference between a first input voltage Vin1 and a second input voltage Vin2 (Vin1−Vin2), rejects the common mode voltages Vcm1 and Vcm2 of both input channels, and produces a high bandwidth high gain multiplication of the voltage difference (Vin1−Vin2) at the output signal.

More specifically, the propagation speed of the linear comparator of the present invention is maximized by relying on the symmetry of the input channels rather than high gain and high linearity at the instrumentation amplifier input stage, which would require additional circuitry and then associated delays. Also, the propagation speed is maximized by setting the operational dynamic input range of the PMOS differential pairs of the instrumentation amplifier input stage to be always greater than the maximum input reference voltage. Finally, the first two stages of the linear comparator are kept in the current domain (differential) so that very fast switching speed can be realized.

Figure 13:
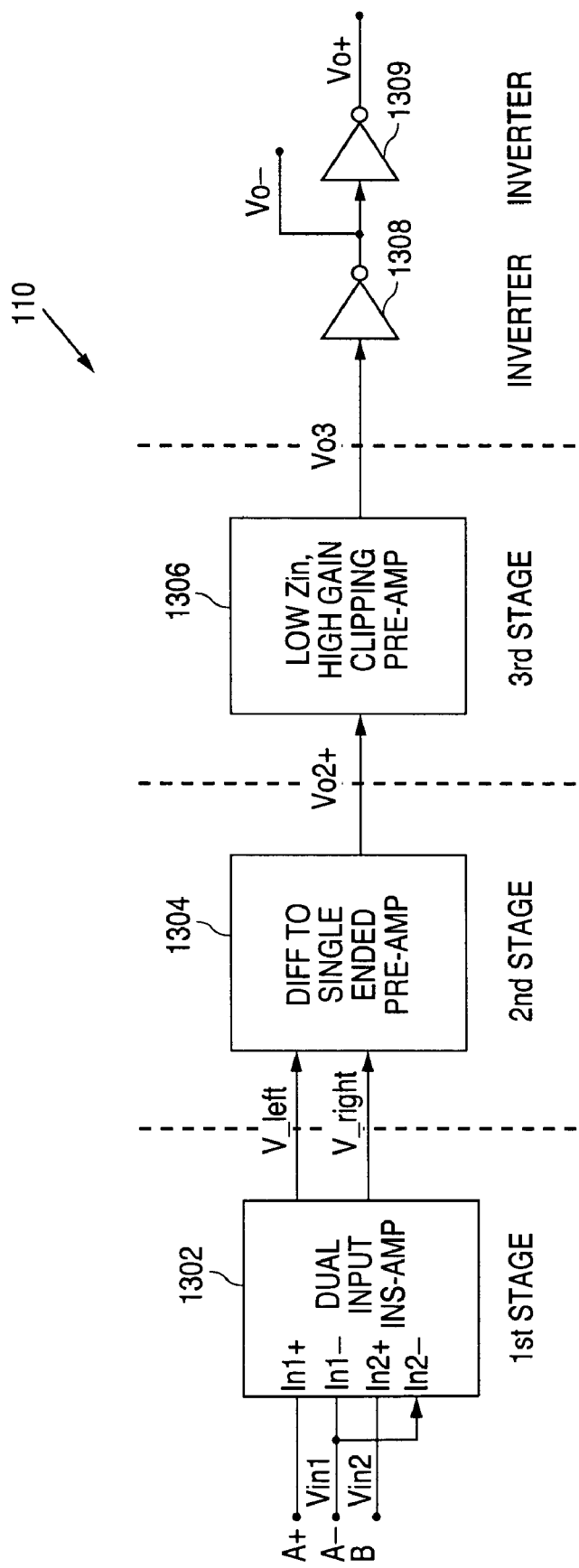
FIG. 13 is a block diagram of the linear comparator according to one embodiment of the present invention.

Referring again to FIG. 2, clock generator circuit 100 includes linear comparator 110 which is implemented using a four-input linear comparator including the novel dual-differential-input (dual-channel) instrumentation amplifier as the comparator input stage. FIG. 13 is a block diagram of a four-input linear comparator according to one embodiment of the present invention which can be incorporated in the clock generator circuit of the present invention for providing a switching output signal as a clock signal.

Referring to FIG. 13, linear comparator 110 is a high speed, non-strobed, continuous-time three-stage comparator incorporating a novel dual-channel instrumentation amplifier as the input stage. In the present embodiment, linear comparator 110 includes three amplification stages but any suitable number of amplification stages can be used in other embodiments. The first amplification stage which is the input stage is implemented as a dual-differential-input instrumentation amplifier 1302 which is a current mode amplifier. Instrumentation amplifier 1302 includes two differential input channels. A first differential input channel in1+ and in1− receives switching voltage reference signals A+ and A− as input signals. A second differential input channel in2+ and in2− receives voltage ramp signal B and switching voltage reference signal A− as input signals. Instrumentation amplifier 1302 generates output error currents which are translated into voltage signals V_left and V_right as output signals.

The input stage is followed by a second current mode amplifier stage 1304. The second amplification stage is implemented as a differential to single ended pre-amplifier. The second stage receives the voltage signals V_left and V_right and generates a single output voltage Vo2+ as output. Voltage Vo2+ is the result of the output current from the second amplification stage, which can be either sinking, sourcing or producing zero current, interacting with the input network of the third amplification stage. The third and last amplification stage 1306 is a low input impedance high gain clipping pre-amplifier and provides an output voltage Vo3 as the output. The output voltage Vo3 is a switching output signal which can be used as the clock signal for the clock generator circuit.

In the present embodiment, inverters 1308 and 1309 are coupled to the output terminal of the third amplification stage 1306 to provide buffering and inversion of the output signal Vo3. Switching output voltages Vo+ and Vo− are thus generated. In the present embodiment, switching output voltage Vo+ is used as the clock signal CLK and is coupled to clock decoder 112 (FIG. 2) for generating clock signals having the desired phase.

A salient feature of the linear comparator of the present invention is the combination of the standard comparator function (having only one input channel and 2 input signals) with an instrumentation amplifier function (having two input channels and four input signals) to achieve a comparison between two sets of two different, non-zero crossing voltages. That is, the linear comparator of the present invention does not need either of its two input channels to have their input Vcm voltages be equal in order to function. The input Vcm voltages at either of the two input channels do not even have to be close to equal. In one embodiment, the input voltages to the first input channel is a corresponding Vcm of the average of gate-to-source voltages of two input transistors, and a differential value of a reference voltage Vref1. In the present embodiment, the value of Vcm for the first input channel has no impact on the comparator output, and likewise, the Vcm of the second input channel can have a value independent of the Vcm of the first input channel.

The operation of linear comparator 110 in generating switching output signal Vo3 can be described as follows. In the present configuration, the differential input signals A+ and A− coupled to the first input channel provides the first input voltage Vin1 of the linear comparator. The first input voltage Vin1 is the PTAT reference voltage Vref1. The difference between the voltage ramp signal B and the switching voltage reference signal A− coupled to the second input channel forms the second input voltage Vin2. Voltage ramp signal B has a magnitude of 3*Vref1 and switching voltage reference signal A− has a magnitude of Vref1. Thus, the second input voltage Vin2 has a voltage magnitude of −2*Vref1. Linear comparator 110 compares the first and second input voltages and provides an output voltage that is a high gain multiplication of the difference between the first input voltage Vin1 and the second input voltage Vin2.

The overall transfer function of linear comparator 110 can be given as follows:

$$G(Vin1)\left[\left(Vcm1 + \frac{Vin1}{2}\right) - \left(Vcm1 - \frac{Vin1}{2}\right)\right] - G(Vin2)\left[\left(Vcm2 + \frac{Vin2}{2}\right) - \left(Vcm2 - \frac{Vin2}{2}\right)\right],$$

wherein G(Vin1) and G(Vin2) denote the respective gain and Vcm1 and Vcm2 denote the respective common mode voltage of the first and second input channels. The above transfer function reduces to:

$$G(Vin1) \times Vin1 - G(Vin2) \times Vin2.$$

When the gains of the two input channels are the same: G(Vin1)=G(Vin2)=G(Vin), the transfer function further reduces to:

$$G(Vin) \times (Vin1 - Vin2).$$

Thus, the output voltage signal Vo3 of linear comparator 110 is a high gain multiplication of the voltage difference between the first input voltage Vin1, being the PTAT reference voltage Vref1 and the second input voltage, being the difference between the voltage ramp signal and one of the switching voltage reference signal.

In linear comparator 110, even though the gain, G(Vin), varies with the input voltage Vin, the gain for both channels is always the same when each Vin voltage is the same. In this manner, symmetry in the instrumentation amplifier input stage is exploited to achieve a very good differential dual-channel comparator while using minimum circuitry, area and power consumption.

Dual Channel Instrumentation Amplifier

Figure 14:
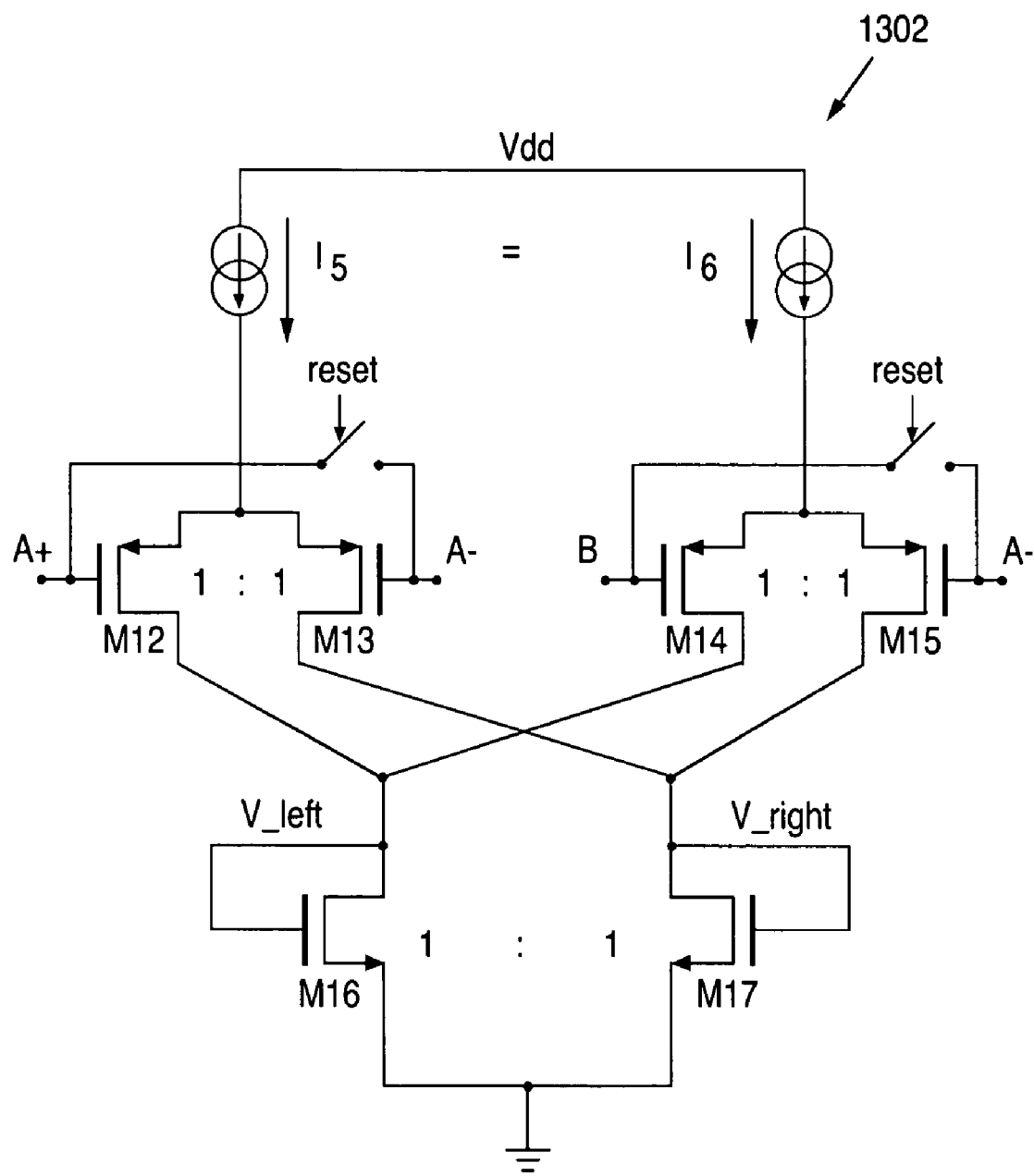
FIG. 14 is a circuit diagram of a dual-differential-input instrumentation amplifier style comparator input stage according to one embodiment of the present invention.

FIG. 14 is a circuit diagram of a dual-differential-input instrumentation amplifier style comparator input stage according to one embodiment of the present invention. The instrumentation amplifier can also be referred to as a "Y-connected" instrumentation amplifier. In the present embodiment, the Y-connected instrumentation amplifier includes two symmetrical (identical) differential PMOS transistor pairs cross-coupled to two diode-connected NMOS transistor loads. The instrumentation amplifier of FIG. 14 forms a high accuracy instrumentation amplifier front end with excellent DC matching and high common mode rejection ratio. Furthermore, the Y-connected instrumentation amplifier used in the linear comparator of the present invention provides the ability to have different common mode at the 2 input channels.

Referring to FIG. 14, Y-connected instrumentation amplifier 1302 includes a first input channel formed by PMOS differential transistor pair M12 and M13. The first input channel receives a first pair of differential input signals. In the present illustration, the first pair of differential input signals is the switching voltage reference signals A+ and A−.

Dual-channel instrumentation amplifier 1302 further includes a second input channel formed by PMOS differential transistor pair M14 and M15. The second input channel receives a second pair of differential input signals. In the present illustration, the second pair of differential input signals is the voltage ramp signal B and one of the switching voltage reference signals, A− in the present case.

In the present embodiment, transistors M12 and M13 in the first input channel have the same area ratio while transistors M14 and 15 in the second input channel also have the same area ratio. Furthermore, the PMOS transistor pairs of the first and second input channels are biased by bias currents I5 and I6 respectively. Bias currents I5 and I6 are equal in the present embodiment. When instrumentation amplifier 1302 is incorporated in linear comparator 110 of clock generator circuit 100, currents I5 and I6 are sub-PTAT currents provided by sub-PTAT current source 102. Also, in the present embodiment, a first reset switch is coupled across the first input channel and a second reset switch is coupled across the second input channel. The reset switches are optional and when incorporated, operate to equalize the voltages at each of the input channels upon reset of the circuit.

The input channels of Y-connected instrumentation amplifier 1302 are cross-coupled to a pair of diode-connected NMOS transistors M16 and M17. Transistors M16 and M17 have the same area ratio. Specifically, the drain terminal of PMOS transistor M12 in the first input channel and the drain terminal of PMOS transistor M14 in the second input channel are coupled to the drain terminal of diode-connected NMOS transistor M16 where voltage V_left is generated. The drain terminal of PMOS transistor M13 in the first input channel and the drain terminal of PMOS transistor M15 in the second input channel are coupled to the drain terminal of diode-connected NMOS transistor M17 where voltage V_right is generated.

In instrumentation amplifier 1302, each input channel has a non-linear I/V characteristic, but, when the differential currents from each input channel cancel at diodes M16 and M17, voltage V_left will equal voltage V_right and both input channels have the same input voltage regardless of any non-linearities. The non-linearity cancellation occurs because the full reference voltage, provided by switching voltage reference signals A+ and A−, appears across the first input channel, creating non-equal Gm in transistors M12 and M13. At equilibrium, the input signals A− and B at the second input channel must have the exact same voltage difference and therefore the exact same non-equal Gm in transistors M15 and M14. As a result, the non-linearity caused by Vin dependent Gm shared in both channels is cancelled.

In the present embodiment, switching reference voltages A+ and A−, each having a magnitude of voltage Vref1, are connected to the first input channel and switching reference voltage A− is connected to the negative terminal of the second input channel while the voltage ramp signal B is connected to the positive terminal of the second input channel. By connecting voltage A− to the negative terminal of the second input channel, a voltage swing at the voltage ramp signal B of 3*Vref1 is realized. A waveform of voltage ramp signal B with 3*Vref1 voltage swing provides overdrives to reduce the delay through the comparator.

Another feature of the instrumentation amplifier of the present invention is that the amplifier is operated in the current mode. If voltages A+ and A− are equal, equal current division between transistors M12 and M13 will result. But with a voltage change as small as +/−93 mV, the currents in transistors M12 and M13 will change substantially. The voltage difference between B and A− creates the same current ratio at the second input channel. While both input channels are running at a non-linear point, both input channels have to be running at mirror image of each other. That is, both input channels must have the same split current ratio. At this operating point, there is no error on the first or second input channel. Essentially, an error free comparator front end is realized.

Figure 15A:
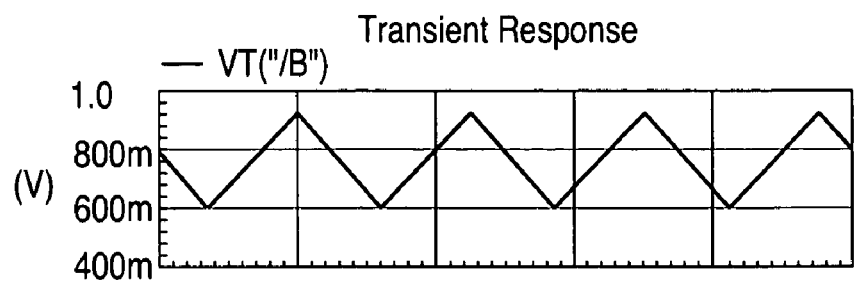
FIG. 15, which includes FIGS. 15A to 15D, includes simulation waveforms illustrating the operation of the instrumentation amplifier of FIG. 14.
Figure 15B:
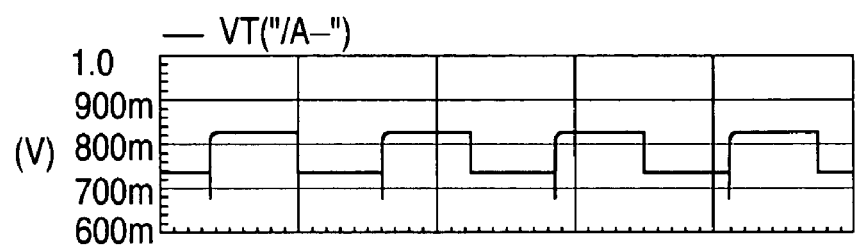
Figure 15C:
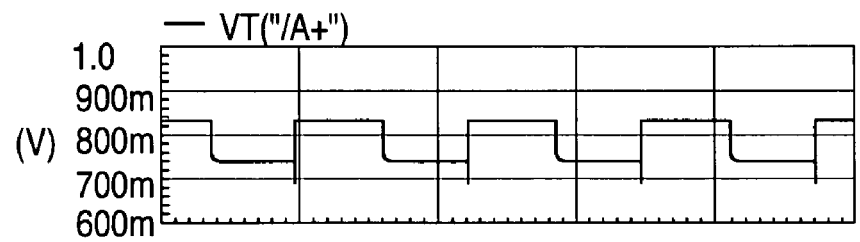
Figure 15D:
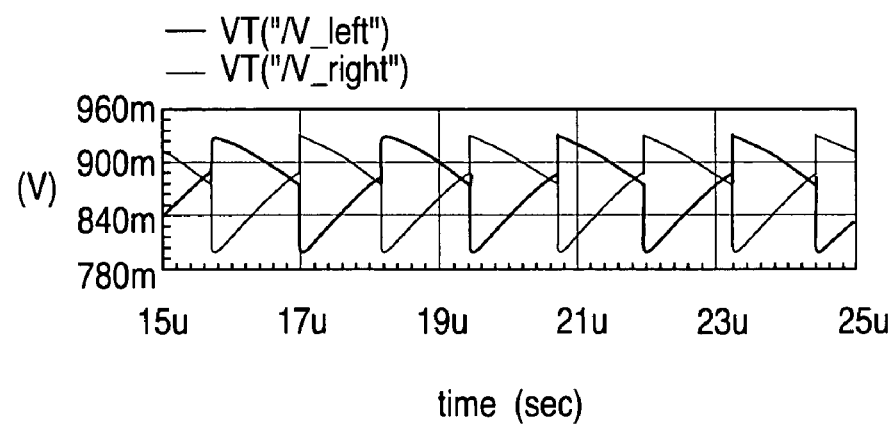

FIG. 15, which includes FIGS. 15A to 15D, includes simulation waveforms illustrating the operation of the instrumentation amplifier. When switching reference voltage signals A+ and A− (FIGS. 15B and 15C) and voltage ramp signal B (FIG. 15A) are provided to the instrumentation amplifier, output voltages V_left and V_right being alternating saw tooth waveforms are generated, as shown in FIG. 15D. Note that at each comparison cycle, the first input voltage Vin1 which is the difference between signals A+ and A− is either −Vref1 or +Vref1 while the second input voltage Vin2 which is the difference between signals B and A− is either +2Vref1 or −2Vref1. Thus, voltage ramp signal B having a voltage swing of 3Vref1 result.

Figure 16:
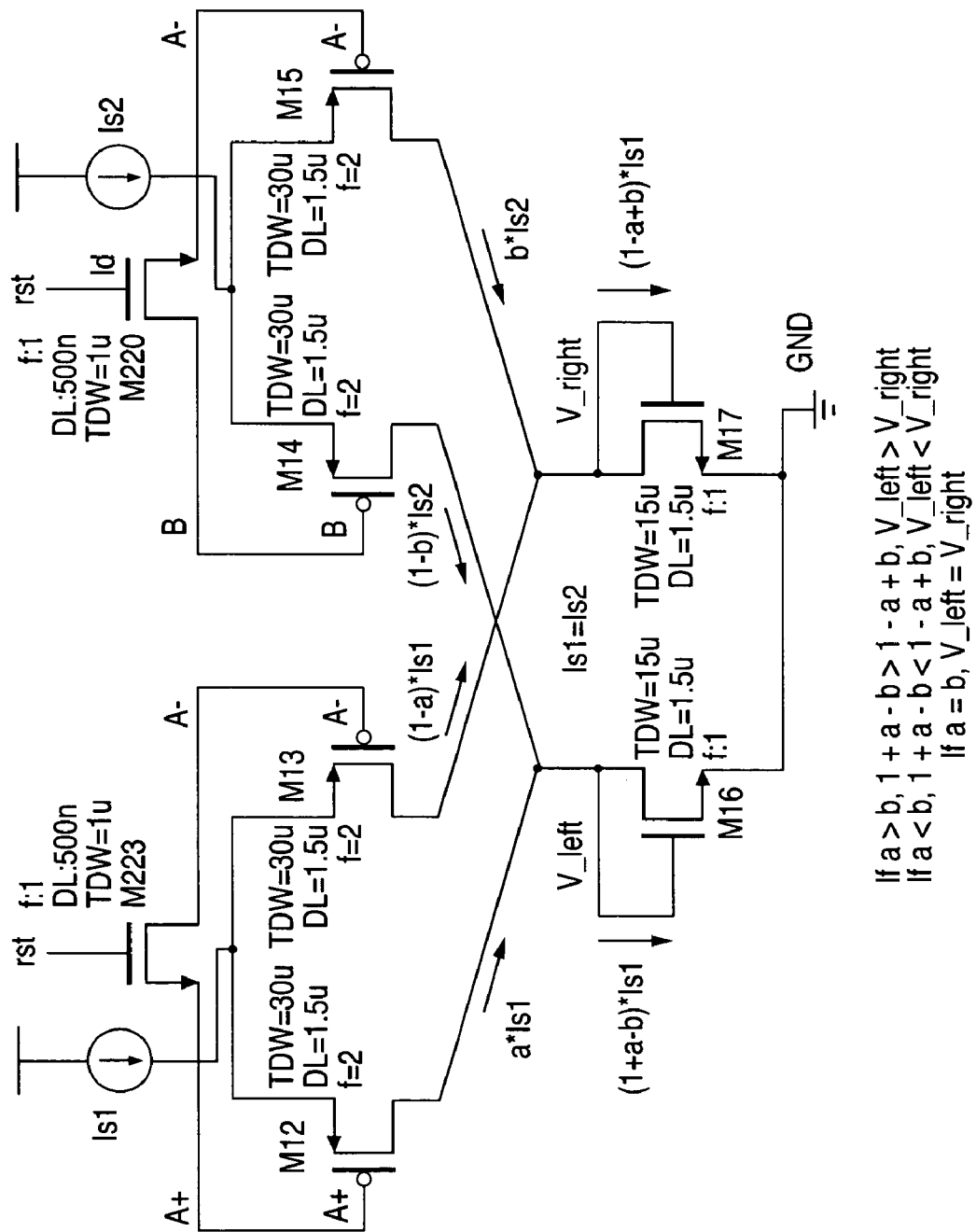
FIG. 16 is a detailed circuit diagram of a dual-differential-input instrumentation amplifier as a comparator first stage according to one embodiment of the present invention.

FIG. 16 is a detailed circuit diagram of a dual-differential-input instrumentation amplifier as a comparator first stage according to one embodiment of the present invention. FIG. 17, which includes FIGS. 17A to 17D, includes simulation waveforms illustrating the operation of the instrumentation amplifier of FIG. 16. Referring to FIG. 16, transistor M12 at the first input channel provides a current a*Is1 (Is1=I5 in FIG. 14) while transistor M13 provides a current (1−a)*Is1. At the second input channel, transistor M14 provides a current (1−b)*Is2 (Is2=I6 in FIG. 14) while transistor M15 provides a current b*Is2. Current Is1 is equal to current Is2. The currents from each transistor of the first and second input channels are cross-coupled and summed at the diode-connected NMOS transistors. Transistor M16 sees a current of (1+a−b)*Is1 while transistor M17 sees a current of (1−a+b)*Is1. If a>b, then voltage V_left is greater than voltage V_right. If a<b, then voltage V_left is less than voltage V_right. If a=b, then voltage V_left equals voltage V_right.

Figure 17A:
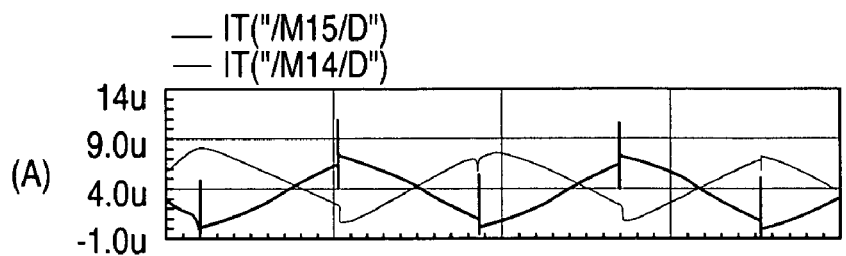
FIG. 17, which includes FIGS. 17A to 17D, includes simulation waveforms illustrating the operation of the instrumentation amplifier of FIG. 16.
Figure 17B:
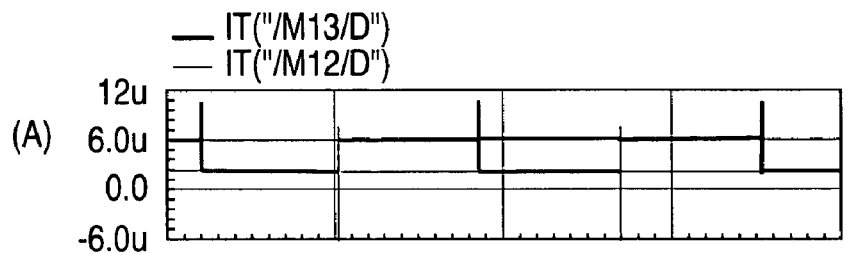
Figure 17C:
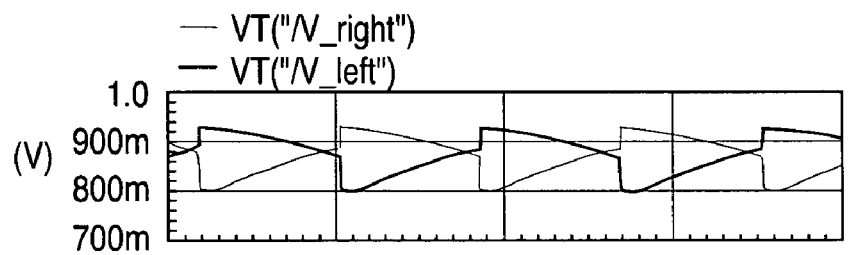
Figure 17D:
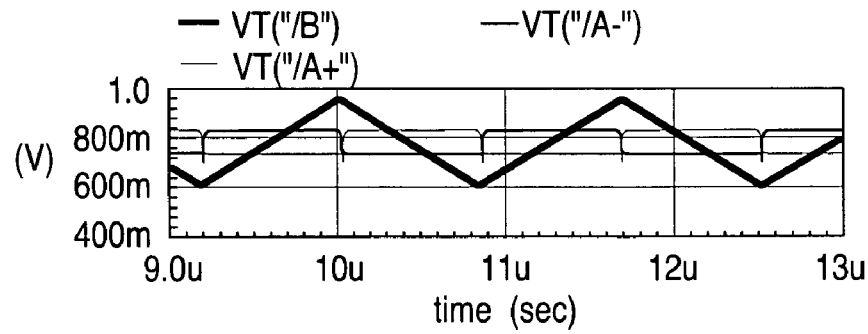

Referring to FIG. 17, the waveforms in FIG. 17A illustrate the drain currents at transistors M14 and M15 while the waveforms in FIG. 17B illustrate the drain currents at transistors M12 and M13 in response to input signals A+, A− and B as shown in FIG. 17D. The triangular voltage ramp signal B has a 3Vref1 voltage swing which is one Vref1 above and one Vref1 below the voltage swing of the square wave switching reference voltage signals A+ and A−. The triangular voltage ramp signal turns around when the current split ratio a/b is one, that is when a=b. Waveforms for voltages V_right and V_left are shown in FIG. 17C.

The dual-channel instrumentation amplifier of the present invention is capable of achieving high accuracy with few low accuracy components. The high performance of the dual-channel instrumentation amplifier of the present invention is made possible by the exploitation of the intrinsic symmetry of the four PMOS transistors used to form the differential pairs of the input channels where the non-linear behaviors of the four PMOS transistors match each other at the comparison decision point and therefore cancel out errors in the comparison.

Second and Third Amplification Stages

Figure 18:
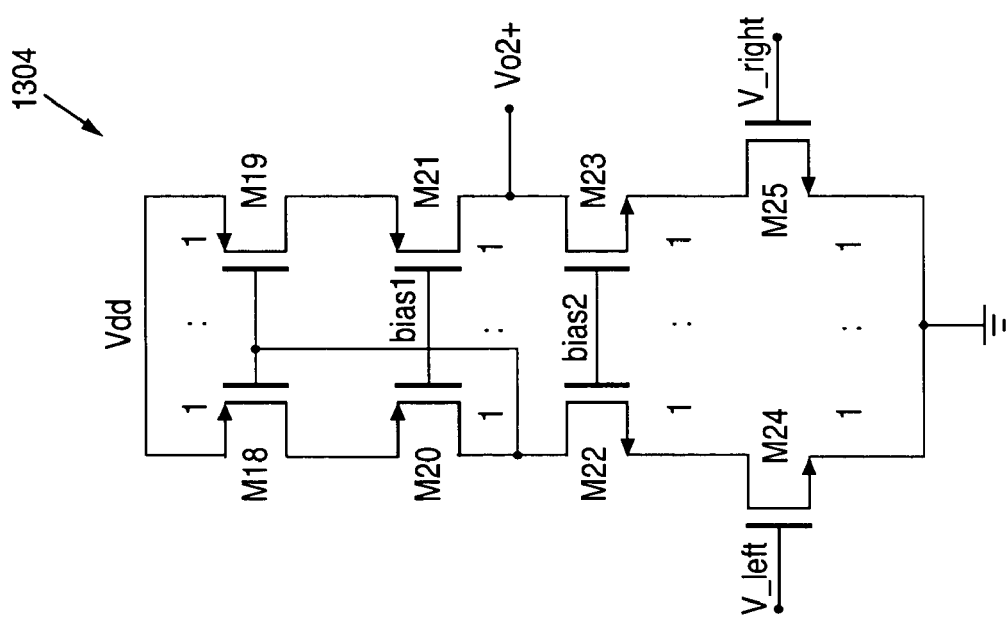
FIG. 18 is a circuit diagram of the second amplification stage of the linear comparator of FIG. 13 according to one embodiment of the present invention.

FIG. 18 is a circuit diagram of the second amplification stage of the linear comparator of FIG. 13 according to one embodiment of the present invention. The second amplification stage 1304 is a differential to single ended pre-amplifier that receives voltages V_left and V_right as input signals and generate output voltage Vo2+.

Figure 19:
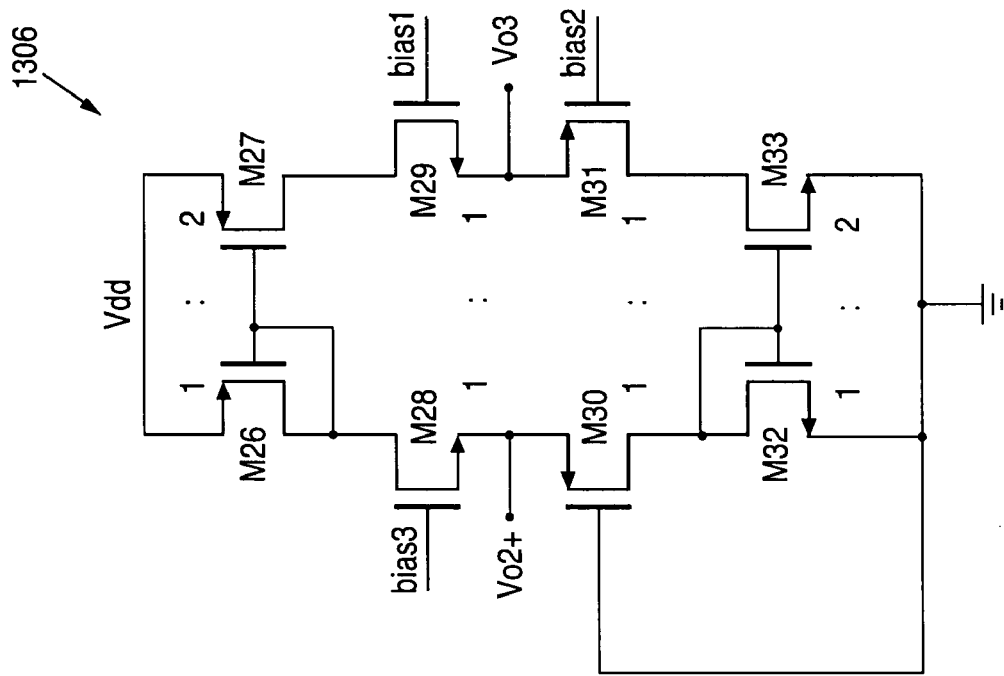
FIG. 19 is a circuit diagram of the third amplification stage of the linear comparator of FIG. 13 according to one embodiment of the present invention.

FIG. 19 is a circuit diagram of the third amplification stage of the linear comparator of FIG. 13 according to one embodiment of the present invention. The third amplification stage 1306 is a low input impedance high gain clipping pre-amplifier which receives voltage Vo2+ as input and generates a voltage Vo3 as output.

Clock Decoder

In the embodiment of the clock generator circuit shown in FIG. 2, the switching output signal Vo+ from linear comparator 110 is taken as the clock CLK signal. The clock CLK signal is provided to clock decoder circuit 112 to generate multi-phase clock signals which can be coupled to circuitry of the integrated circuit in which the clock generator circuit is incorporated. Clock decoder circuits are well known and any clock decoder circuits, presently known or to be developed, can be used in the clock generator circuit of the present invention.

of course, in some applications, the switching output signals Vo+ and Vo− can be used as the clock signals directly without being converted by a clock decoder circuit. Clock decoder 112 in clock generator circuit 100 is therefore optional.

Detailed Clock Generator Circuit

Figure 20:
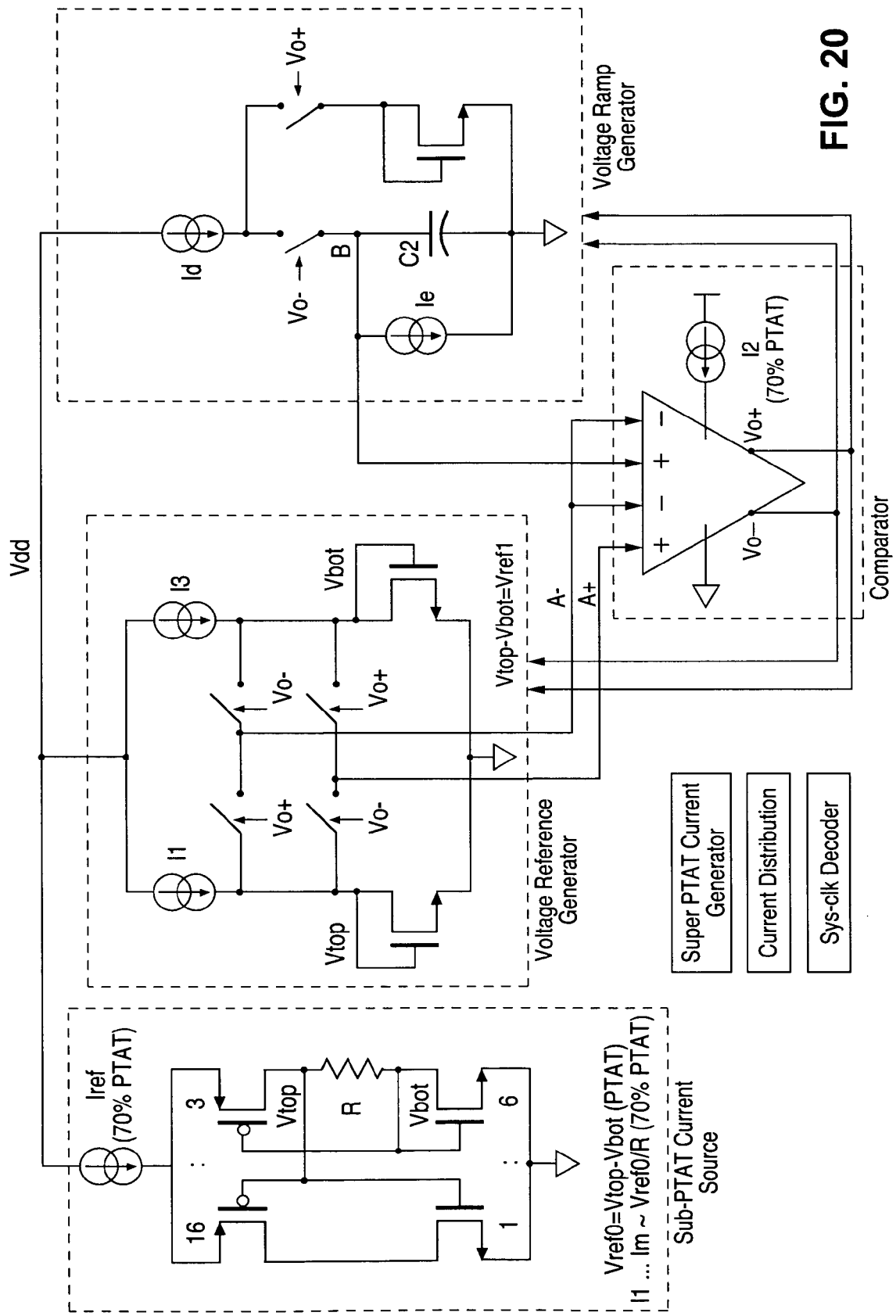
FIG. 20 is a detailed circuit diagram of a clock generator circuit according to one embodiment of the present invention.

FIG. 20 is a detailed circuit diagram of a clock generator circuit according to one embodiment of the present invention. The clock generator circuit in FIG. 20 is configured in the same manner as clock generator circuit 100 of FIG. 2. FIG. 20 includes circuit details for the sub-PTAT current source, the voltage reference generator and the voltage ramp generator to illustrate how the various circuit blocks of the clock generator circuit are interconnected.

Figures 21A, 21B, 21C, 21D, 21E, 21F:
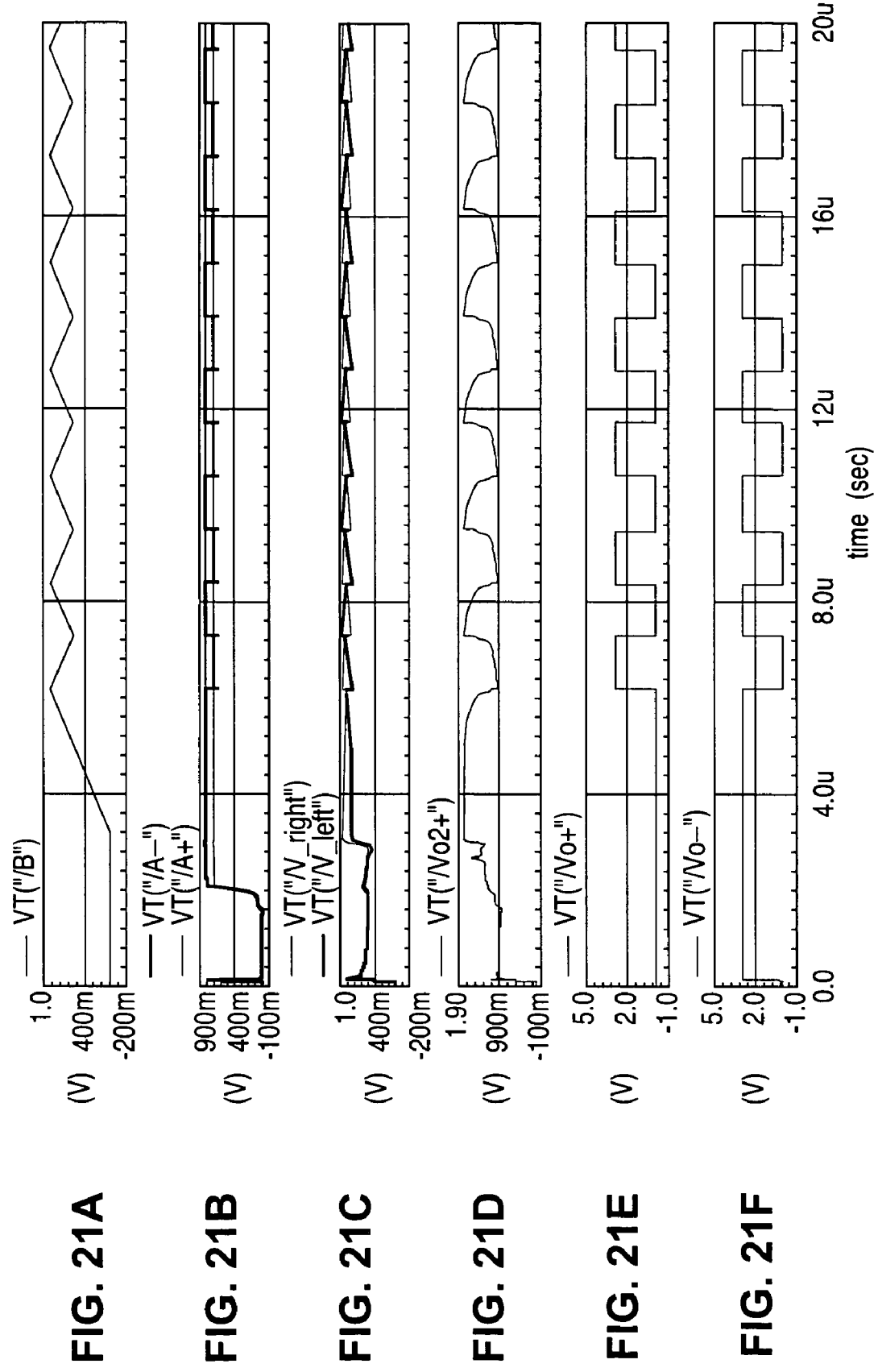
FIG. 21, which includes FIGS. 21A to 21F, includes simulation waveforms illustrating the operation of the clock generator circuit of FIG. 13.

FIG. 21, which includes FIGS. 21A to 21F, includes simulation waveforms illustrating the operation of the clock generator circuit of FIG. 13. As shown in FIG. 21, switching voltage reference signals A+ and A− (FIG. 21B) and voltage ramp signal B (FIG. 21A) are generated and coupled to the linear comparator to generate voltages V_left and V_right (FIG. 21C) after the input stage. Voltage Vo2+ (FIG. 21D) is generated by the second amplification stage of the linear comparator by converting the differential voltages V_left and V_right into a single-end signal. The resulting switching output voltages Vo+ and Vo− (FIGS. 21E and 21F) can be used to generate clock signals having different phase shift.

Figure 22:
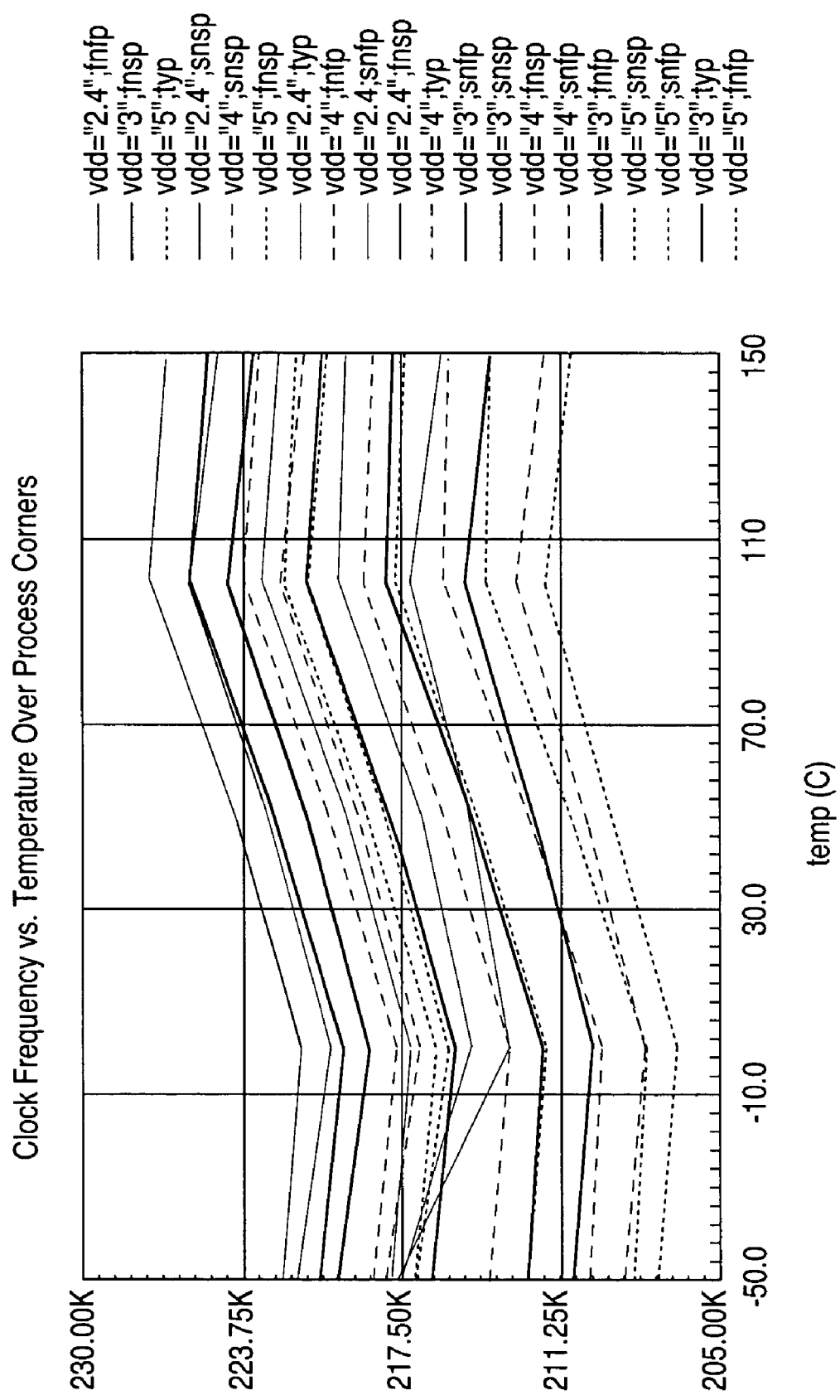
FIG. 22 includes simulation waveforms of the clock generator circuit of FIG. 20 showing the clock frequency versus temperature characteristics at various supply voltages and process conditions.

FIG. 22 includes simulation waveforms of the clock generator circuit of FIG. 20 showing the clock frequency versus temperature characteristics at various supply voltages and process conditions. As shown in FIG. 22, the clock frequency of the clock signal generated by the clock generator circuit of FIG. 20 is substantially stable over a temperature range of −50° C. to 150° C. Specifically, the frequency variation over temperature is less than 5 kHz. Furthermore, the band of waveforms illustrates variation of the clock frequency over Vdd voltages and process conditions. When the clock generator circuit of the present invention is used, the clock frequency of the clock signal only varies by +/−4.6% over temperature, Vdd and process corners. Thus, a very stable clock signal is generated by the clock generator circuit of the present invention.

Alternate Embodiments

As discussed above, the clock generator circuit of FIG. 2 utilities a four-input linear comparator with a novel dual-channel instrumentation amplifier input stage. In other embodiments of the clock generator circuit of the present invention, other linear comparator circuits, presently known or to be developed, can also be used to implement the clock generator circuit of the present invention. When a conventional linear comparator is used in the clock generator circuit of the present invention, the clock generator circuit may not have self-canceling error correction behavior. However, depending on the application in which the clock generator circuit is applied, a small amount of clock frequency error due to process, temperature and power supply variations may be tolerated.

Figure 23:
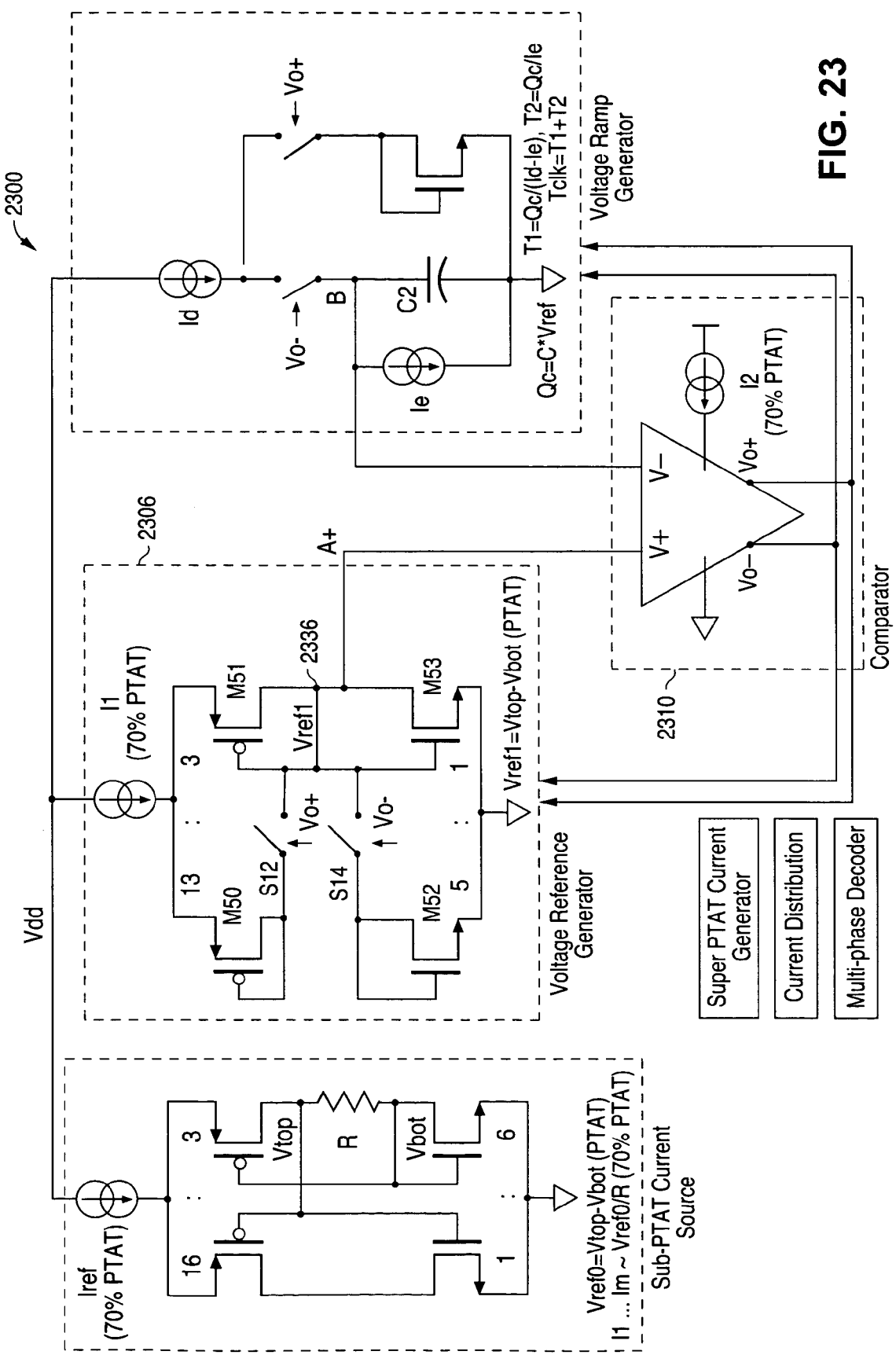
FIG. 23 is a detailed circuit diagram illustrating a clock generator circuit according to an alternate embodiment of the present invention where a two-input linear comparator is used.

FIG. 23 is a detailed circuit diagram illustrating a clock generator circuit according to an alternate embodiment of the present invention where a traditional two-input linear comparator is used. Referring to FIG. 23, clock generator circuit 2300 includes functional blocks that are similar to clock generator circuit 100 of FIG. 2 and similar functional blocks will not be further described. However, in clock generator circuit 2300, a linear comparator 2310 having a single input channel is used to generate the switching output voltages Vo+ and Vo−. Linear comparator 2310 thus receives a switching voltage reference signal A+ and a voltage ramp signal B as input signals. In the present embodiment, a voltage reference generator 2306 is configured to generate a single switching voltage reference signal A+ under the control of switching output voltages Vo+ and Vo−.

Referring to FIG. 23, voltage reference generator 2306 receives a sub-PTAT current I1 as the bias current. Voltage reference generator 2306 includes diode-connected PMOS transistor M50 and diode-connected PMOS transistor M51 connected in parallel between bias current I1 and an output node 2336. Transistor M50 is switchably connected to node 2336 through a switch S12 controlled by switching output voltage Vo+. Voltage reference generator 2306 also includes diode-connected NMOS transistor M52 and diode-connected NMOS transistor M53 connected in parallel between output node 2336 and a power supply voltage, such as the ground node. Transistor M52 is switchably connected to node 2336 through a switch S14 controlled by switching output voltage Vo−.

In the present embodiment, transistor M50 and transistor M51 have an area ratio of 13:3 and transistor M52 and M53 have an area ratio of 5:1.

In operation, when switch S12 is closed and switch S14 is open due to the values of the switching output voltages Vo+ and Vo−, current I1 flows through transistor M50, M51 and transistor M53 to generate a voltage at output node 2336 having a first voltage value. On the other hand, when switch S14 is closed and switch S12 is open due to the values of the switching output voltages Vo+ and Vo−, current I1 flows through transistor M51 and transistor M52 and M53 to generate a voltage at output node 2336 having a second voltage value. The difference between the first and second voltage values is the PTAT reference voltage generated by the sub-PTAT current source. Through the switching action of switches S12 and S14, a switching voltage reference signal A+ having a voltage amplitude of voltage Vref1 is generated.

Figure 24:
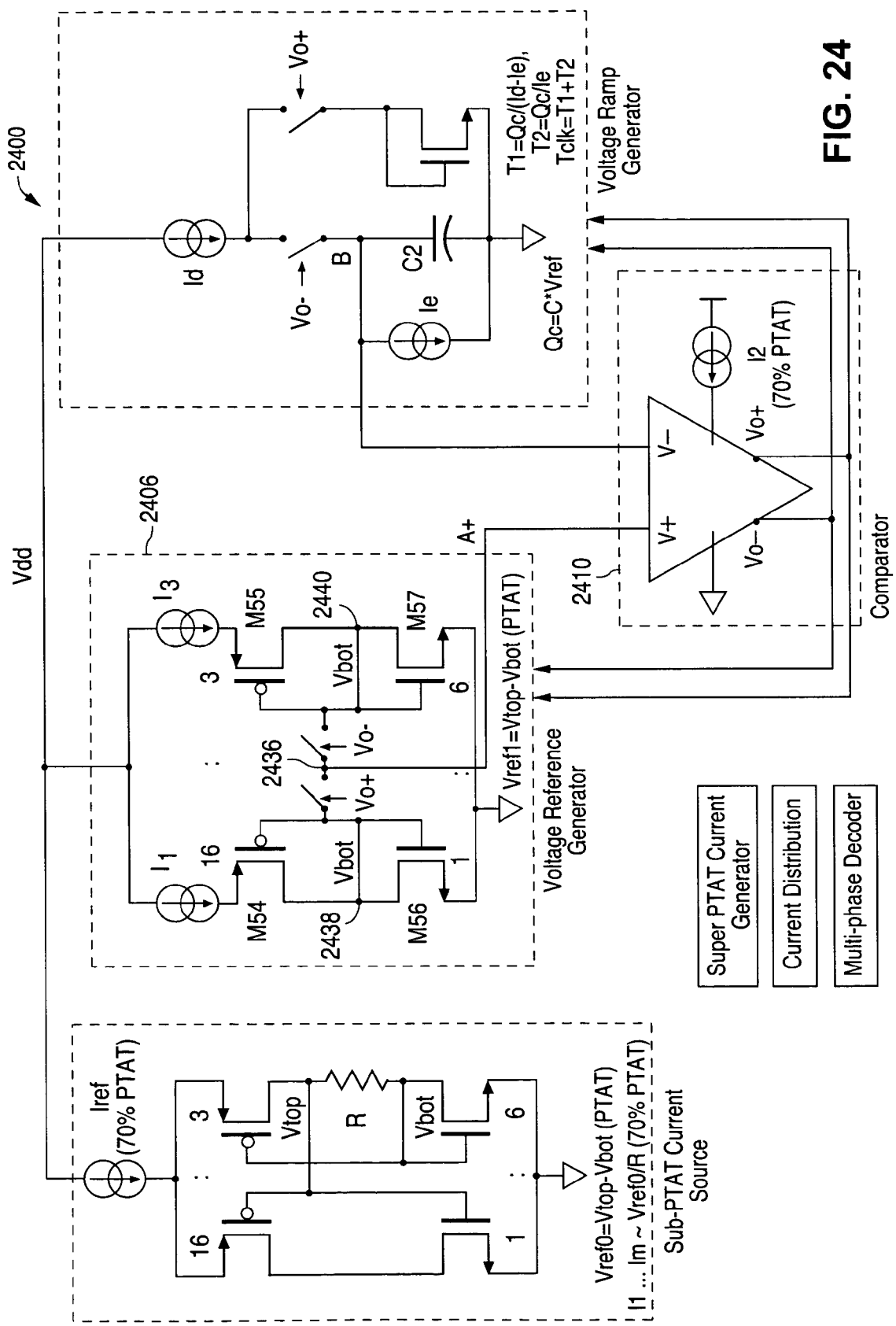
FIG. 24 is a detailed circuit diagram illustrating a clock generator circuit according to a second alternate embodiment of the present invention where a two-input linear comparator is used.

FIG. 24 is a detailed circuit diagram illustrating a clock generator circuit according to a second alternate embodiment of the present invention where a traditional two-input linear comparator is used. Referring to FIG. 24, clock generator circuit 2400 includes functional blocks that are similar to clock generator circuit 100 of FIG. 2 and similar functional blocks will not be further described. However, in clock generator circuit 2400, a linear comparator 2410 including a single input port is used to generate the switching output voltages Vo+ and Vo−. In the embodiment shown in FIG. 24, a voltage reference generator 2406 is provided to generate a single switching voltage reference signal A+ under the control of switching output voltages Vo+ and Vo−.

Referring to FIG. 24, voltage reference generator 2406 includes a first circuit branch biased by a sub-PTAT current I1 and a second circuit branch biased by a sub-PTAT current I3. The first circuit branch includes a diode-connected PMOS transistor M54 connected in series with a diode-connected NMOS transistor M56 between bias current I1 and a power supply voltage, such as the ground node. A voltage Vtop is established at the common node 2438 between transistors M54 and M56. The second circuit branch includes a diode-connected PMOS transistor M55 connected in series with a diode-connected NMOS transistor M57 between bias current I3 and the ground node. A voltage Vbot is established at the common node 2440 between transistors M55 and M57. The two common nodes 2438 and 2440 are switchably connected to an output node 2436 providing the switching voltage reference signal A+. Under the control of switching voltages Vo+ and Vo−, voltage Vtop and voltage Vbot are alternately coupled to output node 2436, thereby generating the switching voltage reference signal A+ having a voltage magnitude of voltage Vref1.

In the present embodiment, transistor M54 and transistor M55 have an area ratio of 16:3 and transistor M56 and M57 have an area ratio of 1:6.

In FIGS. 20, 23 and 24, voltage Vref0 at the sub-PTAT current source is equal to Vtop-Vbot and is a 100% PTAT voltage. When the voltage is turned into a current at resistor R, because of the temperature coefficient of the resistor, the resulting current is only 70% PTAT. However, when voltages Vtop and Vbot are duplicated in voltage reference generator 2306 and 2406, the difference between the two voltages, which is voltage Vref1, remains voltage Vref0 being 100% PTAT.

Advantages

As described above, the clock generator circuit of the present invention includes many unique features to facilitate the generation of a clock signal that is stable over process, Vdd and temperature variations.

First, the Y-connected instrumentation amplifier includes two symmetrical (identical) differential PMOS pairs cross coupling to two NMOS load diodes forming a high accuracy instrumentation amplifier front end with excellent DC matching and high common mode rejection ration.

Second, a reliable 3*Vref1 voltage swing is created as the ramping limit of the voltage ramp signal generated by the voltage ramp generator. The 3*Vref1 voltage swing provides overdrive to compensate for comparator delay.

Third, the comparator's supply currents and bias currents are generated by the trimmable sub-PTAT current source and thus can always be trimmed to the normal value. Using the sub-PTAT current source as the foundation current also stabilizes the amplifier delays, making temperature compensation of comparator delay nearly process independent.

Fourth, by using current mode amplifier, transitions can occur very fast, creating small propagation delays, thus allowing a fast clock signal to be generated.

Lastly, all analog unknown states are eliminated. The clock generator circuit has repeatable startup behavior.

There are other small factor effects on the clock frequency which are not corrected by the clock generator circuit of the present invention. Offset voltage mismatches between the various devices in the circuit exist. This error source is well known and is usually handled by assigning an error budget and sizing the devices until the total impact is below the allotted error. Another error factor is the absolute capacitance of the charging capacitor C2 in the voltage ramp generator. In practice, a trimmable capacitor is used and the capacitance can be optimized during wafer probe process. An on-chip non-volatile memory stores that optimal trim code for the capacitance value.

The above detailed descriptions are provided to illustrate specific embodiments of the present invention and are not intended to be limiting. Numerous modifications and variations within the scope of the present invention are possible. The present invention is defined by the appended claims.

We claim:

1. An instrumentation amplifier comprising:
   a first differential pair of PMOS transistors coupled to receive first and second input signals at first and second input terminals, the first differential pair having common source terminals being biased by a first bias current, the drain terminal of the first PMOS transistor in the first differential pair being coupled to a first node and the drain terminal of the second PMOS transistor in the first differential pair being coupled to a second node;
   a second differential pair of PMOS transistors coupled to receive third and fourth input signals at third and fourth input terminals, the second differential pair having common source terminals being biased by a second bias current, the drain terminal of the first PMOS transistor in the second differential pair being coupled to the first node and the drain terminal of the second PMOS transistor in the second differential pair being coupled to the second node;
   a first diode connected NMOS transistor having gate and drain terminals coupled to the first node and a source terminal coupled to a first power supply voltage; and
   a second diode connected NMOS transistor having gate and drain terminals coupled to the second node and a source terminal coupled to the first power supply voltage,
   wherein the difference between the first and second input signals forms a first input voltage and the difference between the third and fourth input signals forms a second input voltage, the first node provides a first differential output voltage and the second node provides a second differential output voltage such that the first and second differential output voltages are indicative of a difference between the first input voltage and the second input voltage.

2. The instrumentation amplifier of claim 1, wherein a current flowing into the first node has a positive value when the first input voltage is greater than the second input voltage and the current has a negative value when the first input voltage is less than the second input voltage.

3. The instrumentation amplifier of claim 1, wherein the first bias current is equal to the second bias current.

4. The instrumentation amplifier of claim 1, wherein the PMOS transistors in each of the first and second differential pairs are of the same size and the first diode connected NMOS transistor and the second diode connected NMOS transistor are of the same size.

5. The instrumentation amplifier of claim 1, further comprising:
   a first reset switch coupled between the first and second input terminals of the first differential pair; and
   a second reset switch coupled between the third and fourth input terminals of the second differential pair,
   wherein the first reset switch and the second rest switch are closed during reset operations to reset the instrumentation amplifier.

6. The instrumentation amplifier of claim 1, wherein the first bias current is provided by a first current source coupled between a second power supply voltage and the common source terminals of the first differential pair and the second bias current is provided by a second current source coupled between the second power supply voltage and the common source terminals of the second differential pair.

7. The instrumentation amplifier of claim 6, wherein the first current source comprises a first current mirror for mirroring a current generated by a third current source having constant or near constant temperature coefficient and the second current source comprises a second current mirror for mirroring the current generated by the third current source having constant or near constant temperature coefficient.

8. The instrumentation amplifier of claim 1, wherein the first and second input signals comprise first and second switching voltage reference signals having opposite phase, the third input signal comprises the first switching voltage reference signal and the fourth input signal comprises a voltage ramp signal.

9. A linear comparator comprising:
   a dual-channel instrumentation amplifier input stage, each channel of the instrumentation amplifier input stage comprising a pair of differential input terminals receiving a pair of input signals, the dual-channel instrumentation amplifier input stage providing first and second differential output voltages;
   a differential to single ended pre-amplifier coupled to receive the first and second differential output voltages from the dual-channel instrumentation amplifier input stage and providing a third output voltage; and
   a low impedance high gain clipping pre-amplifier coupled to receive the third output voltage and provide a fourth output voltage,
   wherein a first pair of input signals are coupled to a first input channel of the instrumentation amplifier to provide a first input voltage and a second pair of input signals are coupled to a second input channel of the instrumentation amplifier to provide a second input voltage, the fourth output voltage being indicative of a high gain multiplication of the difference between the first input voltage and the second input voltage.

10. The linear comparator of claim 9, wherein the dual-channel instrumentation amplifier input stage comprises:
    a first differential pair of PMOS transistors coupled to receive first and second input signals at first and second input terminals, the first differential pair having common source terminals being biased by a first bias current, the drain terminal of the first PMOS transistor in the first differential pair being coupled to a first node and the drain terminal of the second PMOS transistor in the first differential pair being coupled to a second node;
    a second differential pair of PMOS transistors coupled to receive third and fourth input signals at third and fourth input terminals, the second differential pair having common source terminals being biased by a second bias current, the drain terminal of the first PMOS transistor in the second differential pair being coupled to the first node and the drain terminal of the second PMOS transistor in the second differential pair being coupled to the second node;
    a first diode connected NMOS transistor having gate and drain terminals coupled to the first node and a source terminal coupled to a first power supply voltage; and
    a second diode connected NMOS transistor having gate and drain terminals coupled to the second node and a source terminal coupled to the first power supply voltage,
    wherein the difference between the first and second input signals forms a first input voltage and the difference between the third and fourth input signals forms a second input voltage, the first node provides a first differential output voltage and the second node provides a second differential output voltage such that the first and second differential output voltages are indicative of a difference between the first input voltage and the second input voltage.

11. The linear comparator of claim 10, wherein a current flowing into the first node has a positive value when the first input voltage is greater than the second input voltage and the current has a negative value when the first input voltage is less than the second input voltage.

12. The linear comparator of claim 10, wherein the first bias current is equal to the second bias cent.

13. The linear comparator of claim 10, wherein the PMOS transistors in each of the first and second differential pairs are of the same size and the first diode connected NMOS transistor and the second diode connected NMOS transistor are of the same size.

14. The linear comparator of claim 10, further comprising:
    a first reset switch coupled between the first and second input terminals of the first differential pair; and
    a second reset switch coupled between the third and fourth input terminals of the second differential pair,
    wherein the first reset switch and the second rest switch are closed during reset operations to reset the instrumentation amplifier.

15. The linear comparator of claim 10, wherein the first and second input signals comprise first and second switching voltage reference signals having opposite phase, the third input signal comprises the first switching voltage reference signal and the fourth input signal comprises a voltage ramp signal, and wherein the fourth output voltage being a switching output signal for used as a clock signal.

* * * * *